(12) United States Patent
Hayashida et al.

(10) Patent No.: US 9,399,693 B2
(45) Date of Patent: Jul. 26, 2016

(54) RESIN COMPOSITION FOR PHOTOIMPRINTING, PATTERN FORMING PROCESS AND ETCHING MASK

(75) Inventors: Yoshihisa Hayashida, Ichihara (JP); Takuro Satsuka, Ichihara (JP); Teruyo Ikeda, Ichihara (JP); Norio Futaesaku, Ichihara (JP); Toshifumi Takemori, Chuo-ku (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 224 days.

(21) Appl. No.: 13/979,527

(22) PCT Filed: Dec. 2, 2011

(86) PCT No.: PCT/JP2011/077988
§ 371 (c)(1),
(2), (4) Date: Jul. 12, 2013

(87) PCT Pub. No.: WO2012/096071
PCT Pub. Date: Jul. 19, 2012

(65) Prior Publication Data
US 2013/0288021 A1    Oct. 31, 2013

(30) Foreign Application Priority Data

Jan. 13, 2011    (JP) ................. 2011-004522

(51) Int. Cl.
| | |
|---|---|
| *C08F 226/12* | (2006.01) |
| *G03F 7/032* | (2006.01) |
| *B82Y 10/00* | (2011.01) |
| *B82Y 40/00* | (2011.01) |

(Continued)

(52) U.S. Cl.
CPC ............... *C08F 226/12* (2013.01); *B05D 3/12* (2013.01); *B82Y 10/00* (2013.01); *B82Y 40/00* (2013.01); *C08F 2/50* (2013.01); *C08J 3/28* (2013.01); *C09D 4/00* (2013.01); *G03F 7/0002* (2013.01); *G03F 7/027* (2013.01); *G03F 7/032* (2013.01); *H01L 21/3081* (2013.01); *Y10T 428/24802* (2015.01)

(58) Field of Classification Search
CPC .............................................. Y10T 428/24802
See application file for complete search history.

(56) References Cited

U.S. PATENT DOCUMENTS 5,772,905 A    6/1998    Chou
5,858,614 A    1/1999    Sato et al.

FOREIGN PATENT DOCUMENTS

CN    101493541 A    7/2009
JP    6 301322    10/1994

(Continued)

OTHER PUBLICATIONS

Machine translation JP 2010-116529 acquired Jun. 10, 2015.*

(Continued)

*Primary Examiner* — Gerard Higgins
(74) *Attorney, Agent, or Firm* — Oblon, McClelland, Maier & Neustadt, L.L.P.

(57) ABSTRACT

A resin composition for photoimprinting, a cured product of the resin composition which is excellent in etching and heat resistance, and a pattern forming process using the resin composition are provided. The resin composition contains photocurable monomer (A) containing at least one carbazole compound of formula (I):

(I)

a photocurable monomer (B) containing at least one compound of the following formulae (II), (III), and (IV):

(II)

(III)

(IV)

and a photopolymerization initiator (C). The weight ratio of the photocurable monomer (A) to the photocurable monomer (B) is from 30/70 to 87/13.

9 Claims, 1 Drawing Sheet

(51) Int. Cl.
*G03F 7/00* (2006.01)
*B05D 3/12* (2006.01)
*C08J 3/28* (2006.01)
*H01L 21/308* (2006.01)
*C08F 2/50* (2006.01)
*G03F 7/027* (2006.01)
*C09D 4/00* (2006.01)

(56) References Cited

FOREIGN PATENT DOCUMENTS

| | | |
|---|---|---|
| JP | 7 309947 | 11/1995 |
| JP | 2007 72374 | 3/2007 |
| JP | 2007 84625 | 4/2007 |
| JP | 2008 19292 | 1/2008 |
| JP | 2010 612 | 1/2010 |
| JP | 2011 81902 | 4/2011 |
| TW | 200936611 | 9/2009 |
| WO | 2010 137501 | 12/2010 |

OTHER PUBLICATIONS

Office Action issued on May 6, 2014 in the corresponding Chinese Application No. 201180061231.8 (with English Translation).

U.S. Appl. No. 14/347,474, filed Mar. 26, 2014, Hayashida, et al.

Choi, T. B.B.J., et al., "Step and flash imprint lithography: Template surface treatment and defect analysis", J. Vac. Sci. Technol. B, vol. 18, No. 6, pp. 3572-3577, (Nov./Dec. 2000).

Kumar, A., et al., "Features of gold having micrometer to centimeter dimensions can be formed through a combination of stamping with an elastomeric stamp and an alkanethiol "ink" followed by chemical etching", Appl. Phys. Lett., vol. 63, No. 14, pp. 2002-2004, (Oct. 4, 1993).

Catalog of PAK-01 manufactured by Toyo Gosei Co., Ltd., Total 2 Pages, URL: http://www.toyogosei.co.jp/business/nanotechnology02.html, (Dec. 10, 2009).

International Search Report Issued Mar. 27, 2012 in PCT/JP11/077988 Filed Dec. 2, 2011.

Taiwanese Office Action issued in connection with corresponding Taiwanese Patent Application No. 100144660, filed Dec. 5, 2011.

\* cited by examiner

RESIN COMPOSITION FOR PHOTOIMPRINTING, PATTERN FORMING PROCESS AND ETCHING MASK

TECHNICAL FIELD

The present invention relates to a resin composition for photoimprinting, a cured product of which is excellent in the etching resistance, a pattern forming process using it, and an etching mask.

BACKGROUND ART

As a method of forming a fine pattern on a semiconductor substrate or a metal substrate, heretofore, photolithography which comprises applying a photosensitive resin to a substrate, forming a pattern by light exposure via a mask, and etching the substrate using the photosensitive resin as a mask has been employed.

However, photolithography has problems in that its process is complicated, and an exposure apparatus and the like are very expensive, thus increasing the cost. Further, if there is a distortion or a fine protrusion on the substrate, the resolution will not be high due to the problem of the depth of focus and as a result, the pattern formation accuracy is highly problematic.

Therefore, as a method to form a fine pattern at a low cost by the contact process, an imprinting method has been disclosed (for example, Patent Document 1). The imprinting method is a technique of pressing a mold having a desired pattern against a resin material applied to a substrate to form a desired pattern on the resin on the substrate. As the imprinting method, a thermal imprinting method of forming a pattern by heat using a thermosetting resin and a photoimprinting method of forming a pattern by light irradiation using a photocurable resin have been known.

Particularly, the photoimprinting method attracts attention in recent years, since a pattern can be formed at low temperature under low pressure, whereby no heating and cooling processes are necessary, and a high throughput can be expected (Non-Patent Documents 1 and 2). As the photocurable resin to be used for photoimprinting, PAK-01 manufactured by Toyo Gosei Co., Ltd. has been known (Non-Patent Document 3).

Further, as a method of processing a fine pattern on a substrate, a dry etching method may be mentioned, and in a case where a substrate is processed using a photoimprinting method, since a photocurable resin is used as a resist mask at the time of etching, the etching resistance is required. Patent Document 2 discloses an example of improvement in the etching resistance by incorporating an acrylic monomer having a cyclic structure.

PRIOR ART DOCUMENTS

Patent Documents

Patent Document 1: U.S. Pat. No. 5,772,905
Patent Document 2: JP-A-2007-84625
Patent Document 3: JP-A-2007-72374
Patent Document 4: JP-A-2008-019292
Patent Document 5: JP-A-2010-000612

Non-Patent Documents

Non-Patent Document 1: T. Bailey, B. J. Chooi, M. Colburn, M. Meissi, S. Shaya, J. G. Ekerdt, S. V. Screenivasan, C. G. Willson: J. Vac. Sci. Technol., B18 (2000) p. 3572

Non-Patent Document 2: A. Kumar, G. M. Whitesides: Appl. Phys. Lett, 63 (1993) p. 2002
Non-Patent Document 3: Catalog of PAK-01 manufactured by Toyo Gosei Co., Ltd.

DISCLOSURE OF INVENTION

Technical Problem

In the above-mentioned conventional photoimprinting, a compound in a curable composition for photoimprinting may volatilize after applied to a substrate such as a silicon (Si) wafer until imprinting and curing.

Particularly when a curable composition is applied in the form of a thin film, since the surface area (specific surface area) per unit volume is large, the air-liquid interface is large, and if the vapor pressure is high and the volatility is high, the compound is highly likely to volatilize in a large amount with an increase in the specific surface area at the time of film formation, even though the film is formed at a temperature lower than the boiling point of the compound.

In the above case, the composition of the curable composition on the substrate tends to change during the film formation, or the amount of the resin on the substrate tends to be reduced, whereby the pattern forming property is impaired. Further, the ratio of volatilization at the time of film formation is higher as the film becomes thinner since the specific surface area becomes larger, and such is a problem in a case where the curable composition for photoimprinting is used and applied to a substrate such as a Si wafer, followed by imprinting and curing.

Further, a method of forming a pattern under reduced pressure or forming a pattern in an atmosphere of nitrogen after depressurization, using a curable composition, in order to avoid curing inhibition by oxygen or humidity, has been known. If a curable composition is used for pattern formation by such a production method including a step under reduced pressure, the vapor pressure which is a function of temperature is relatively increased to the total pressure after depressurization, whereby the compound is more likely to volatize. Accordingly, the method including a step under reduced pressure at the time of pattern formation, the same problem as above is considered to arise.

Further, Patent document 3 discloses, as a resin composition for photoimprinting at room temperature excellent in the etching resistance, a resin composition containing a high molecular weight silicon compound having a photocurable function, however, if the resin itself has a Si structure, hard residue containing inorganic components may form after the etching, thus leading to breakage of a substrate. Accordingly, the resin structure is preferably made of an organic substance.

Patent Document 4 discloses, as a photocurable composition which is excellent in all of the photocuring property, the adhesion, the releasability, the residual layer property, the pattern shape, the coating property and the etching suitability, which is hardly volatile, and which is less likely to stimulate the skin, a photocurable composition containing a polymerizable compound, a photopolymerization initiator, a fluorinated surfactant and a silicone surfactant, having a viscosity at 25° C. of from 3 to 18 mPa·s. As the polymerizable compound, benzyl (meth)acrylate, ethoxylated phenyl (meth)acrylate, vinylcaprolactam and vinylcarbazole may, for example, be mentioned.

However, since the above composition obtained by using such compounds has a low viscosity, although it has a good coating property, it is poor in the stability after coating. Accordingly, if it takes long until photocuring, the coating film may flow and the substrate surface is exposed, or the solid component is likely to be insolubilized, and insoluble matters precipitate, and as a result, there may be a portion on which no pattern transfer is conducted.

Patent Document 5 discloses, as a curable composition for nanoimprinting which is suitable for spin coating and slit coating, which is capable of fine pattern forming, which has a high adhesion to a substrate after photocured, and which makes it easy to separate the resist, for example, a curable composition for nanoimprinting containing a monofunctional polymerizable compound such as N-vinylcaprolactam, vinylcarbazole or benzyl acrylate and a photopolymerization initiator.

However, if a monofunctional polymerizable compound is contained in a large amount, although the releasability of a cured resin tends to be good, the cured resin tends to have low strength, the fine pattern shape is likely to collapse, and the etching resistance is not sufficient.

Further, an etching mask using a curable resin composition containing linear molecules in a large amount as in Non-Patent Document 3 (PAK-01), does not have sufficient etching resistance to carry out processing of resistance material or high aspect processing.

Under these circumstances, it is an object of the present invention to provide a resin composition for photoimprinting, a cured product of which is excellent in the etching resistance, as an etching mask which is applicable to photoimprinting, components of which on a substrate are less likely to volatilize even at the time of forming a pattern of a thin film of a cured product of the resin composition, which is capable of forming a favorable pattern, and which is used for processing of a substrate with high accuracy; a pattern forming process using it; and an etching mask.

Solution to Problem

The present inventors have conducted extensive studies to achieve the above objects and as a result, found that by using a resin composition for photoimprinting containing as photocurable monomers at least one specific compound (A) having a cyclic hydrocarbon structure having a carbazole skeleton and a compound (B) having a specific cyclic hydrocarbon structure, the volatility of components in the resin composition is suppressed, and further, an obtainable cured product is excellent in the etching resistance and is suitable as an etching mask for processing of a substrate with high accuracy.

The present invention has been accomplished on the basis of the above discovery, and provides the following.

1. A resin composition for photoimprinting, comprising a photocurable monomer (A), a photocurable monomer (B) and a photopolymerization initiator (C), wherein the photocurable monomer (A) contains at least one carbazole compound represented by the following formula (1), the photocurable monomer (B) contains at least one member selected from the group consisting of compounds represented by the following formulae (2), (3) and (4), and the weight ratio of the photocurable monomer (A) to the photocurable monomer (B) (the weight of the photocurable monomer (A)/the weight of the photocurable monomer (B)) is from 30/70 to 87/13:

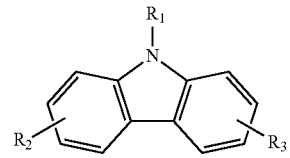

Formula (1)

wherein $R_1$ is —CH=CH$_2$, —CH$_2$CH$_2$—O—CH=CH$_2$, —CH$_2$—C(CH$_3$)=CH$_2$ or a glycidyl group, and each of $R_2$ and $R_3$ which may be the same of different, is hydrogen or a $C_{1-4}$ alkyl group;

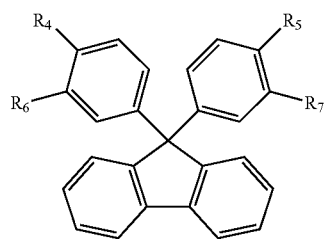

Formula (2)

wherein each of $R_4$ and $R_5$ which may be the same of different, is —O—CH=CH$_2$, —O—CH$_2$CH$_2$—O—CH=CH$_2$, —O—CO—CH=CH$_2$, —O—CO—C(CH$_3$)=CH$_2$, —O—CH$_2$CH$_2$—O—CO—CH=CH$_2$, —O—CH$_2$CH$_2$—O—CO—C(CH$_3$)=CH$_2$ or a glycidyl ether group, and each of $R_6$ and $R_7$ which may be the same or different, is hydrogen or a $C_{1-4}$ alkyl group;

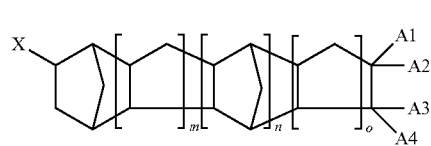

Formula (3)

wherein X is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, each of A1 to A4 which are independent of one another, is a hydrogen atom, a methyl group, an ethyl group, a phenyl group, —OH, —CH$_2$—OH, —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, provided that at least one of A1 to A4 is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, and each of m, n and o is 0 or 1; and Formula (4)

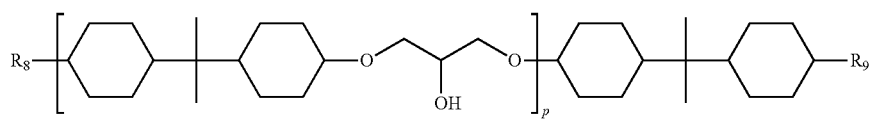

wherein each of $R_8$ and $R_9$ which may be the same or different, is —O—CH=CH$_2$, —O—CH$_2$CH$_2$—O—CH=CH$_2$, —O—CO—CH=CH$_2$, —O—CO—C(CH$_3$)=CH$_2$, —O—CH$_2$CH$_2$—O—CO—CH=CH$_2$, —O—CH$_2$CH$_2$—O—CO—C(CH$_3$)=CH$_2$ or a glycidyl ether group, and p is an integer of 0 or at least 1.

2. The resin composition for photoimprinting according to the above 1, which further contains a viscosity-adjusting agent (D) in an amount of from 0.1 to 100 parts by weight per 100 parts by weight of the total weight of the photocurable monomer (A) and the photocurable monomer (B).

3. The resin composition for photoimprinting according to the above 2, wherein the viscosity-adjusting agent (D) is a polymer having a carbazole skeleton.

4. The resin composition for photoimprinting according to any one of the above 1 to 3, which further contains a solvent (G) in an amount of from 0.5 to 30,000 parts by weight per 100 parts by weight of the total weight of the photocurable monomer (A) and the photocurable monomer (B).

5. A resin thin film for photoimprinting, comprising a cured product having a film thickness of from 10 nm to 40 μm obtained from the resin composition for photoimprinting as defined in any one of the above 1 to 4.

6. A pattern forming process comprising:
    a step of applying the resin composition for photoimprinting as defined in any one of the above 1 to 4 to a substrate to form a coating film;
    a step of bringing a pattern surface of a mold having a desired pattern into contact with the surface of the coating film of the resin composition and pressurizing them to fill the space in the pattern with the resin composition;
    a step of curing the resin composition by light irradiation; and
    a step of separating the mold from the cured resin.

7. The pattern forming process according to the above 6, which further has a step of etching the substrate using the cured resin as a mask.

8. A fine structure, which is obtained by bringing a pattern surface of a mold having a desired pattern into contact with the resin surface of the resin composition for photoimprinting as defined in any one of the above 1 to 4, pressurizing them to fill the space in the pattern with the resin composition, curing the resin composition by light irradiation and separating the mold from the cured resin.

9. An etching mask comprising a cured product of the resin composition for photoimprinting as defined in any one of the above 1 to 4.

Advantageous Effects of Invention

By the resin composition for photoimprinting of the present invention, the volatility after application in the form of a thin film on a substrate is suppressed, and further, an obtainable cured product is excellent in the etching resistance and is suitable as an etching mask for processing of a substrate with high accuracy.

DESCRIPTION OF EMBODIMENTS

Figure 1:
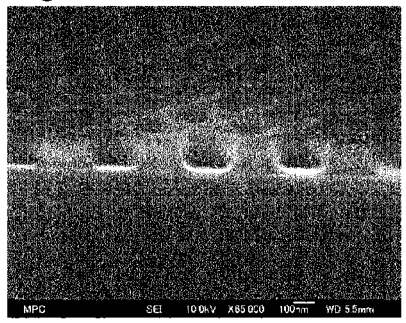
FIG. 1 is a SEM image of a transfer pattern of a fine structure by photoimprinting in Example 24.

The resin composition for photoimprinting of the present invention contains, as a photocurable monomer (A), at least one carbazole compound represented by the above formula (1). As its effect, due to a high carbon density, high etching resistance, and a sensitizing effect at the time of photocuring can be expected.

In the carbazole compound represented by the formula (1), $R_1$ is —CH=CH$_2$, —CH$_2$CH$_2$—O—CH=CH$_2$, CH$_2$—C(CH$_3$)=CH$_2$ or a glycidyl group. $R_1$ is preferably —CH=CH$_2$, —CH$_2$CH$_2$—O—CH=CH$_2$ or a glycidyl group. Each of $R_2$ and $R_3$ which may be the same or different, is hydrogen or a C$_{1-4}$ alkyl group. Each of $R_2$ and $R_3$ is preferably hydrogen, a methyl group or an ethyl group, particularly preferably hydrogen or a methyl group.

As preferred examples of the carbazole compound represented by the formula (1), the following compounds may be mentioned.

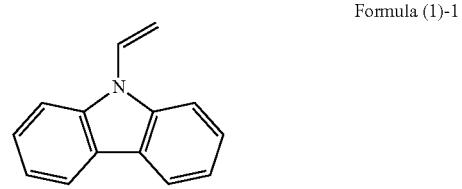

Formula (1)-1

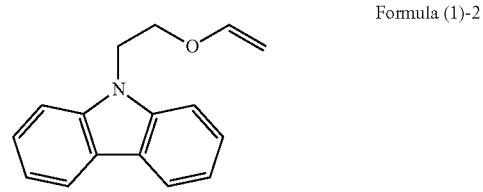

Formula (1)-2

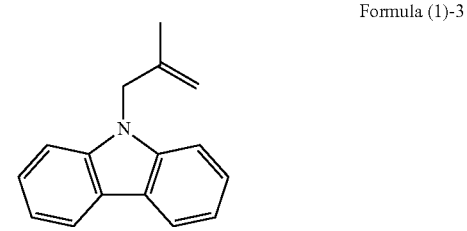

Formula (1)-3

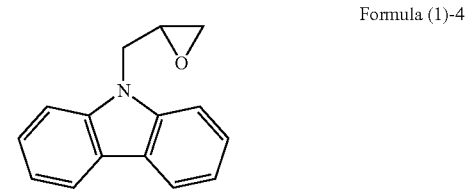

Formula (1)-4

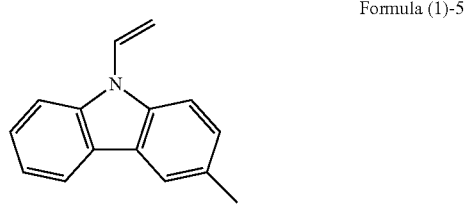

Formula (1)-5

Formula (1)-6

Formula (1)-7

Formula (1)-8

Formula (1)-9

Formula (1)-10

Formula (1)-11

Formula (1)-12

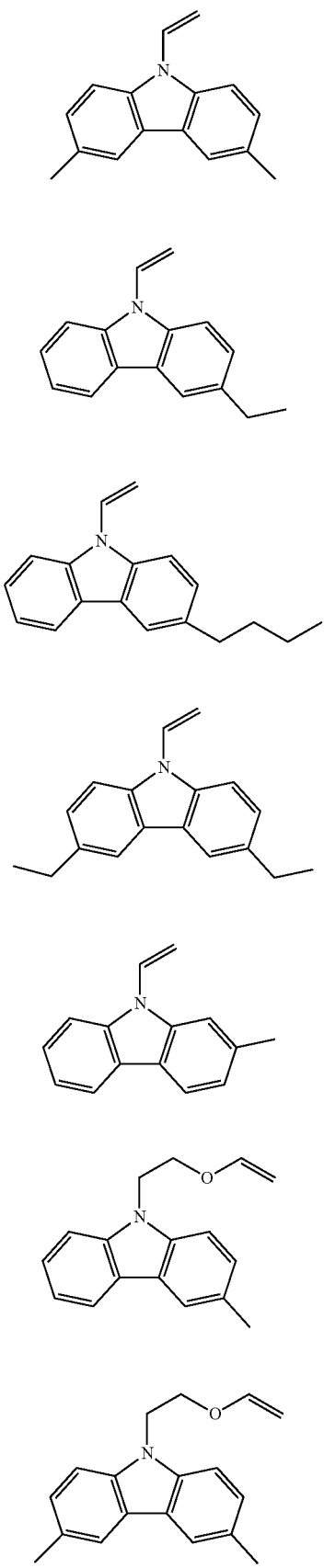

Formula (1)-17

Formula (1)-18

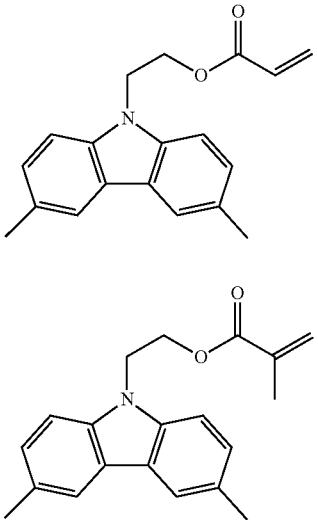

Among them, more preferred are compounds of the formulae (1)-1, (1)-2, (1)-3, and (1)-4.

Further, particularly preferred are compounds of the formulae (1)-1, (1)-2, and (1)-4.

The carbazole compounds of the formula (1) may be used in combination of two or more.

The resin composition for photoimprinting of the present invention contains, as the photocurable monomer (B), at least one member of compounds represented by the formulae (2) to (4).

The effect by the photocurable monomer (B) represented by the formulae (2) to (4) is that a resin obtained by mixing with the photocurable monomer (A) represented by the formula (1), followed by curing, has etching resistance higher than that of a resin obtained by curing the photocurable monomer (B) by itself.

Particularly, the effect by incorporating the photocurable monomer (B) represented by the formula (2) is estimated to be such that the etching resistance is further improved by a high carbon density due to the aromatic ring and by the interaction between π-electrons of the aromatic ring of the photocurable monomer (A) represented by the formula (1) and the aromatic ring of the photocurable monomer (B) represented by the formula (2). In addition, it can be expected that the fine structure will hardly be broken since the structure after cured is rigid, and the cure shrinkage is small.

The effect by incorporating the photocurable monomer (B) represented by the formula (3) is estimated to be such that the carbon density is high since the formula (3) has a crosslink structure, and due to a structure with high heat resistance, the composition is hardly susceptible to heat at the time of etching, whereby the etching resistance is further improved.

Further, the effect by incorporating the photocurable monomer (B) represented by the formula (4) is estimated to be such that the monomer of the formula (4) has a flexible structure, and further, the reaction sites are increased by the photocurable monomer (A), whereby the reaction of the monomers is likely to occur, and the crosslink density is improved, whereby the etching resistance is further improved.

In the fluorene compound having a cyclic hydrocarbon structure represented by the formula (2), each of $R_4$ and $R_5$ which may be the same or different, is —O—CH=CH$_2$, —O—CH₂CH₂—O—CH=CH₂, —O—CO—CH=CH₂, —O—CO—C(CH₃)=CH₂, —O—CH₂CH₂—O—CO—CH=CH₂, —O—CH₂CH₂—O—CO—C(CH₃)=CH₂ or a glycidyl ether group. Each of R₄ and R₅ is particularly preferably —O—CH₂CH₂—O—CH=CH₂, —O—CO—CH=CH₂, —O—CO—C(CH₃)=CH₂, —O—CH₂CH₂—O—CO—CH=CH₂, —O—CH₂CH₂—O—CO—C(CH₃)=CH₂ or a glycidyl ether group. Each of R₆ and R₇ which may be the same or different, is hydrogen or a C₁₋₄ alkyl group. Each of R₆ and R₇ is preferably hydrogen, a methyl group or an ethyl group, particularly preferably hydrogen or a methyl group.

As preferred examples of the fluorene compound represented by the formula (2), the following compounds may be mentioned.

Formula (2)-1
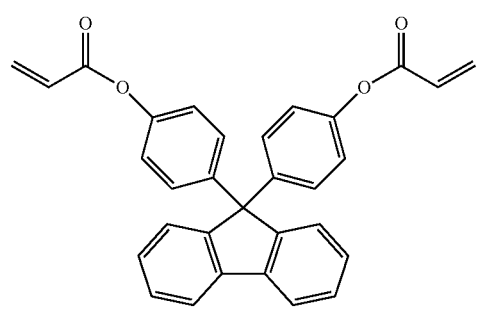

Formula (2)-2
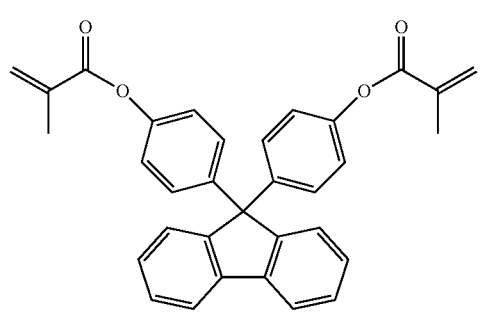

Formula (2)-3
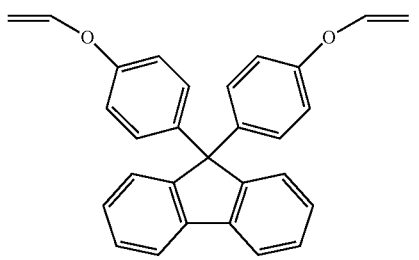

Formula (2)-4
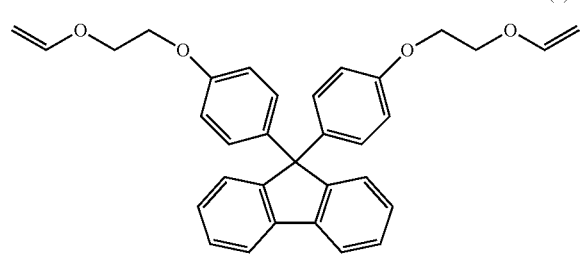

-continued

Formula (2)-5
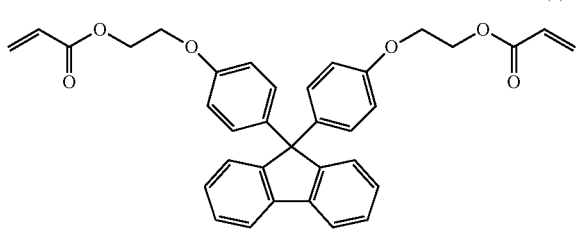

Formula (2)-6
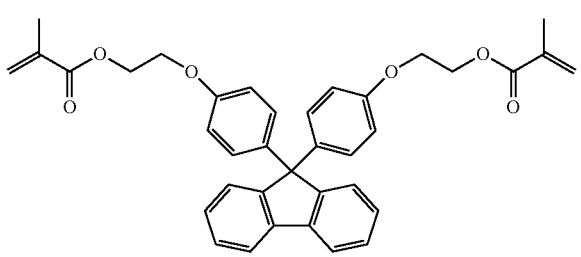

Formula (2)-7
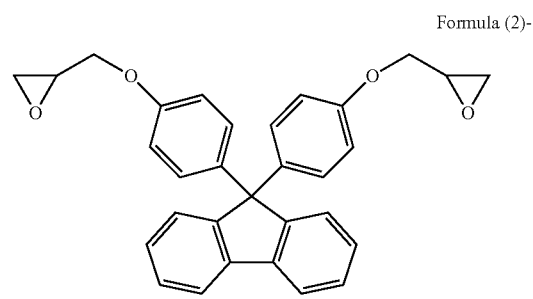

Formula (2)-8
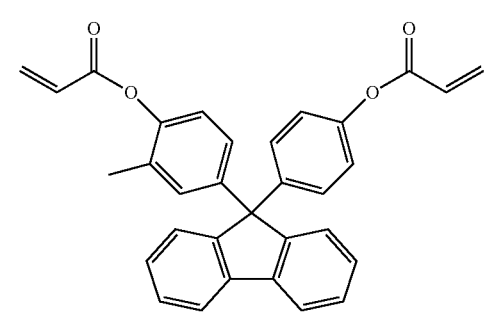

Formula (2)-9
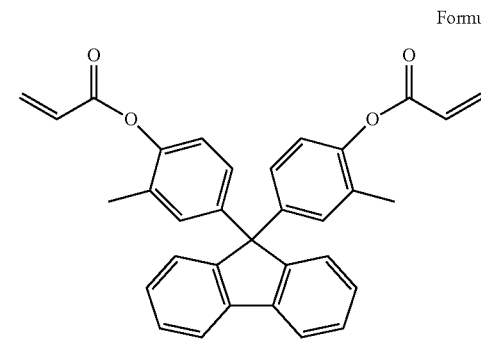

Formula (2)-10
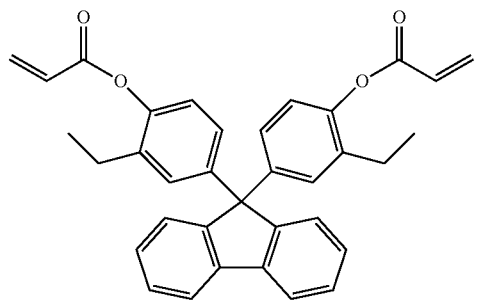
Formula (2)-11
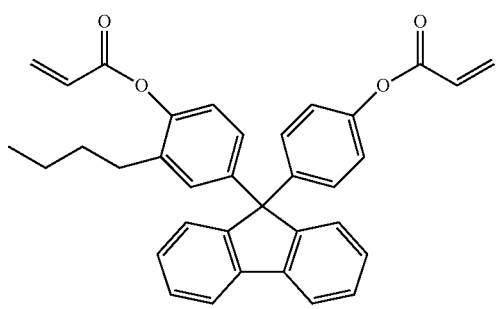
Formula (2)-12
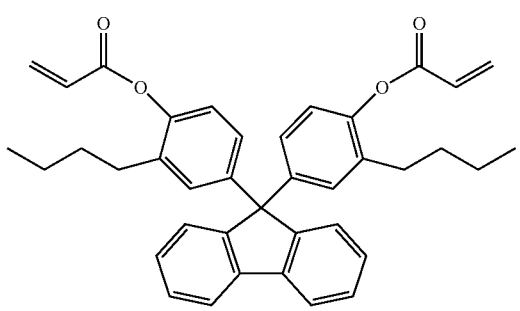
Formula (2)-13
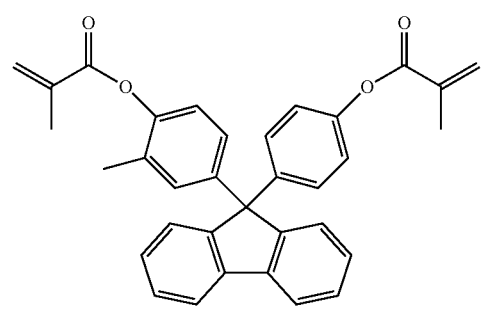
Formula (2)-14
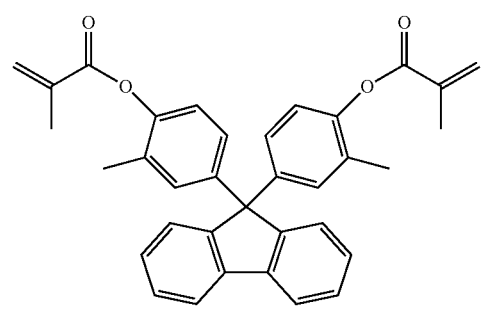
Formula (2)-15
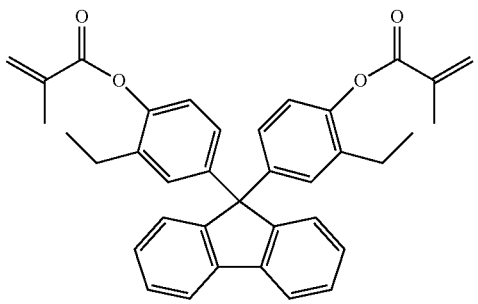
Formula (2)-16
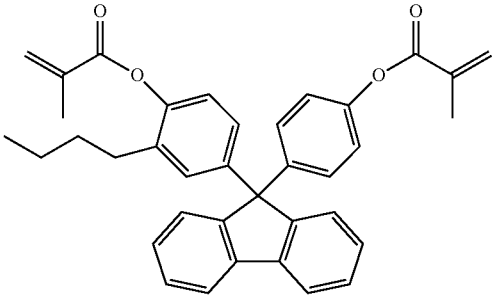
Formula (2)-17
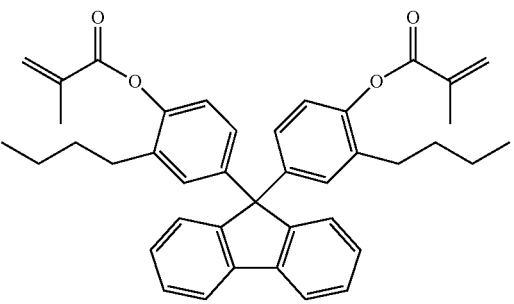
Formula (2)-18
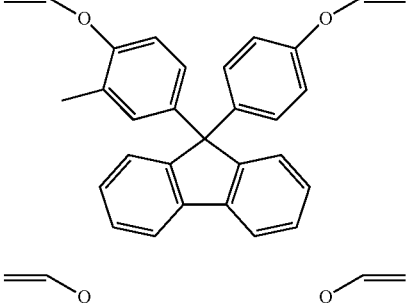
Formula (2)-19
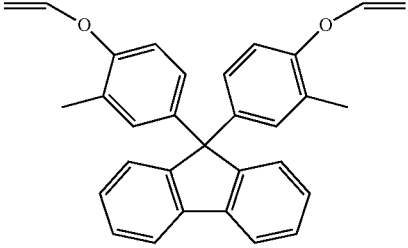

Formula (2)-20
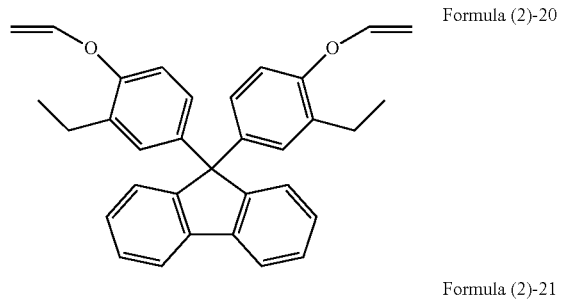
Formula (2)-21
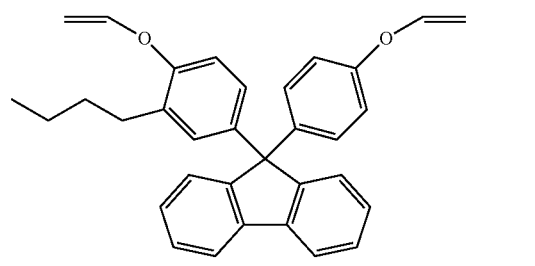
Formula (2)-22
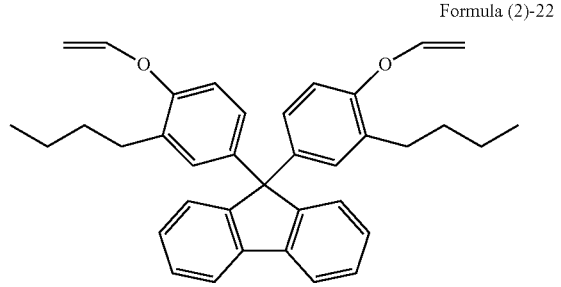
Formula (2)-23
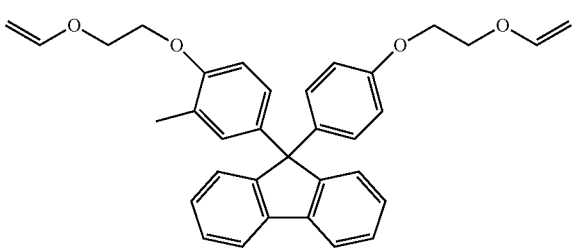
Formula (2)-24
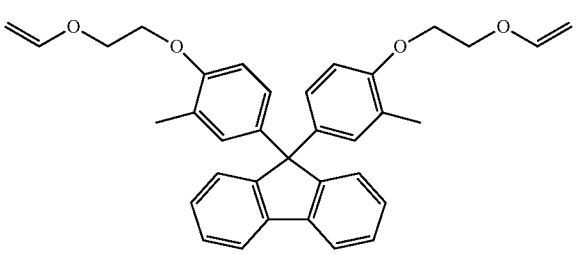
Formula (2)-25
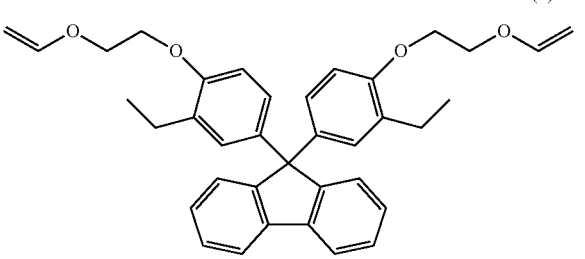
Formula (2)-26
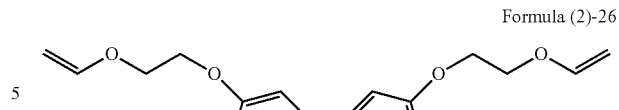
Formula (2)-27
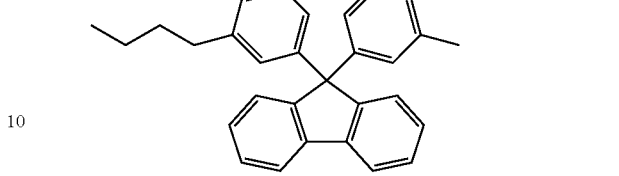
Formula (2)-28
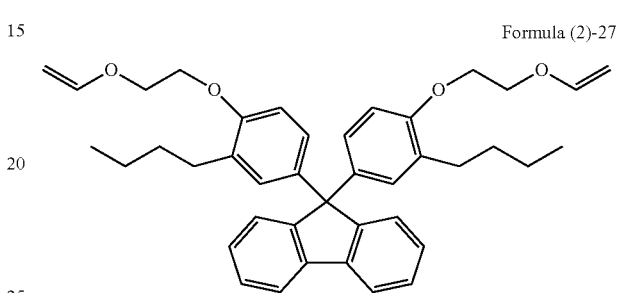
Formula (2)-29
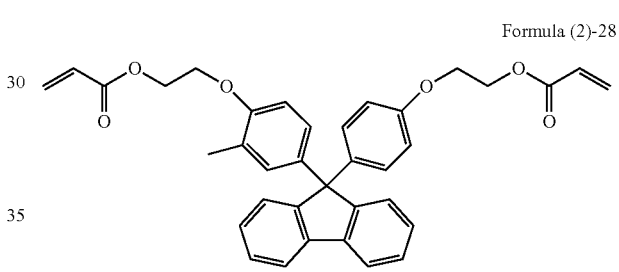
Formula (2)-30
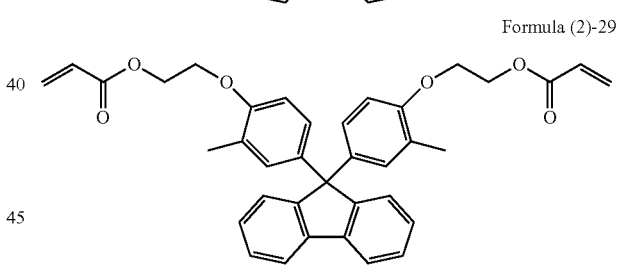
Formula (2)-31
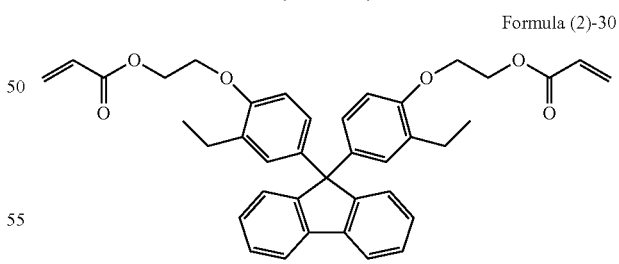
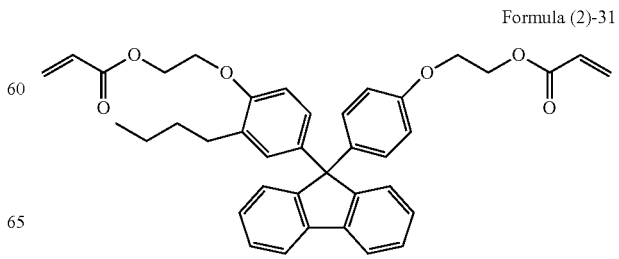

Formula (2)-32
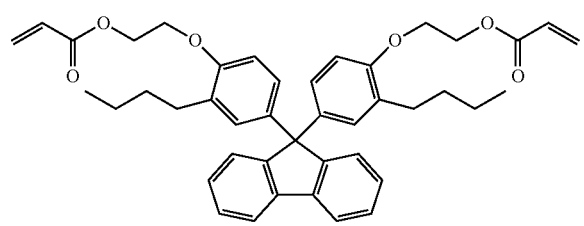
Formula (2)-33
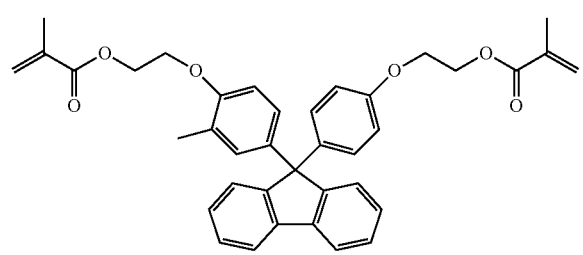
Formula (2)-34
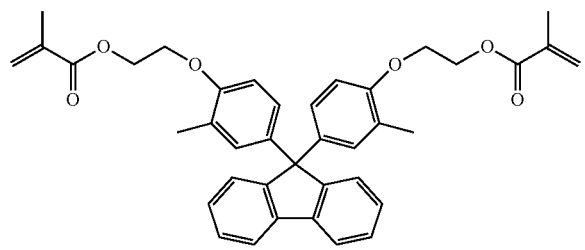
Formula (2)-35
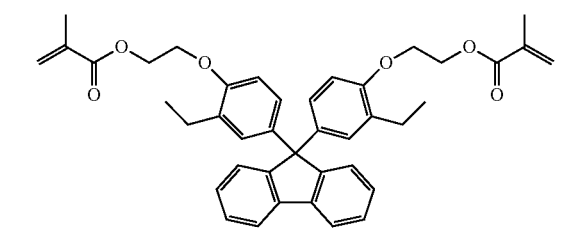
Formula (2)-36
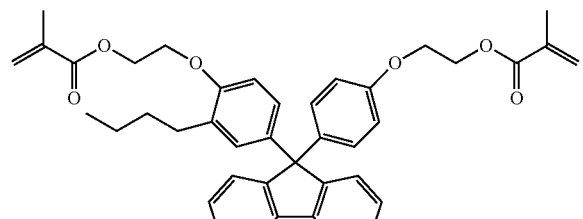
Formula (2)-37
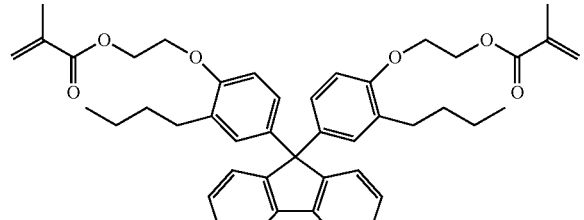
Formula (2)-38
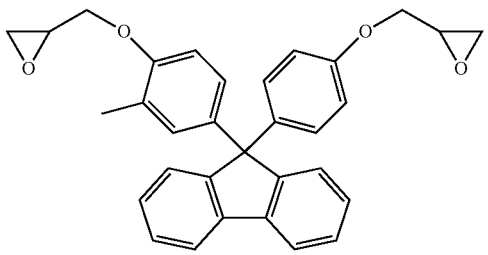
Formula (2)-39
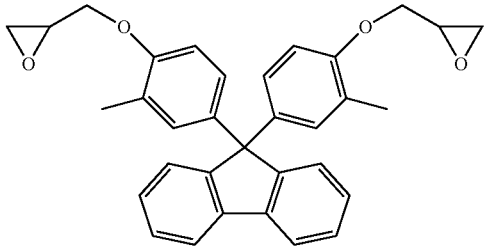
Formula (2)-40
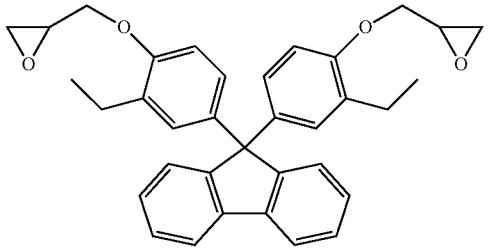
Formula (2)-41
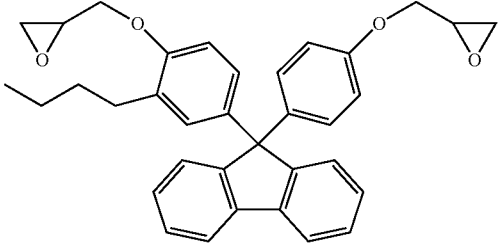
Formula (2)-42
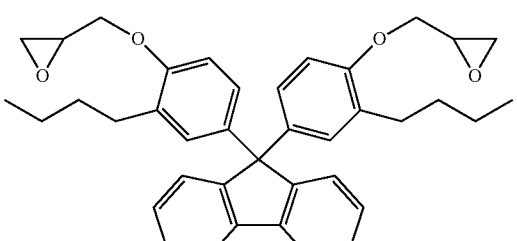
Among them, more preferred are compounds of the formulae (2)-1, (2)-2, (2)-3, (2)-4, (2)-5, (2)-6, (2)-7, (2)-8, (2)-9, (2)-13, (2)-14, (2)-18, (2)-19, (2)-23, (2)-24, (2)-28, (2)-29, (2)-33, (2)-34, (2)-38 and (2)-39.
Further, among them, particularly preferred are compounds of the formulae (2)-1, (2)-2, (2)-3, (2)-4, (2)-5, (2)-6, (2)-7, (2)-9, (2)-14, (2)-19, (2)-24, (2)-29, (2)-34 and (2)-39.
The fluorene compounds represented by the formula (2) may be used in combination of two or more.

In the cyclic hydrocarbon compound having a crosslink structure represented by the formula (3), X is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, each of A1 to A4 which are independent of one another, is a hydrogen atom, a methyl group, an ethyl group, a phenyl group, —OH, —CH$_2$—OH, —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group.

Here, at least one of A1 to A4 is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group. Each of m, n and o is 0 or 1.

X is particularly preferably —O—CH=CH$_2$, —CH$_2$—O—CH=CH$_2$, —O—CO—CH=CH$_2$, —O—CO—C(CH$_3$)=CH$_2$ or a glycidyl ether group.

Each of A1 to A4 is preferably a hydrogen atom, a methyl group, —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, particularly preferably a hydrogen atom, —O—CH=CH$_2$, —CH$_2$—O—CH=CH$_2$, —O—CO—CH=CH$_2$, —O—CO—C(CH$_3$)=CH$_2$ or a glycidyl ether group.

Among them, more preferred are compounds represented by the following formulae.

Formula (3)-1

Formula (3)-2

Formula (3)-3

Formula (3)-4

Formula (3)-5

Formula (3)-6

Formula (3)-7

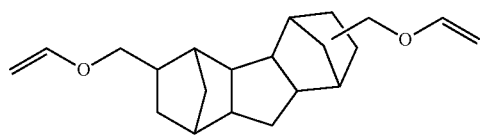

Formula (3)-8

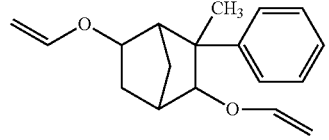

Formula (3)-9

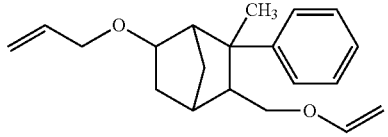

Formula (3)-10

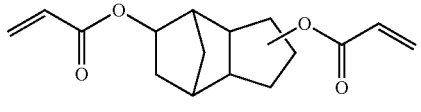

Formula (3)-11

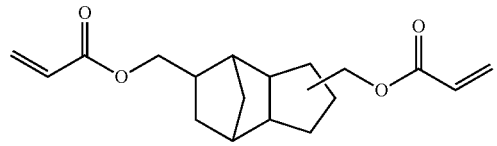

Formula (3)-12

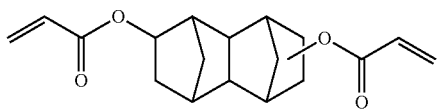

Formula (3)-13

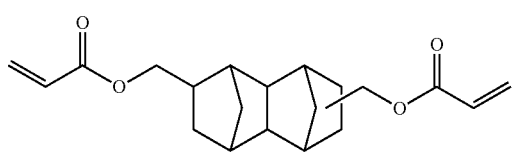

Formula (3)-14

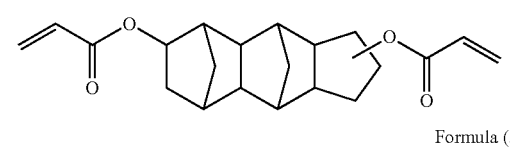

Formula (3)-15

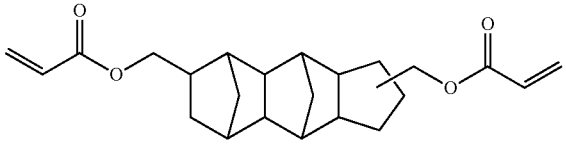

Formula (3)-16

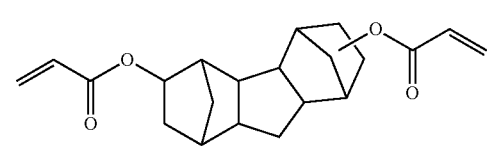

Formula (3)-17

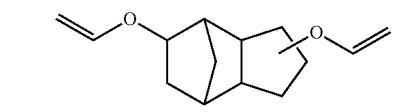
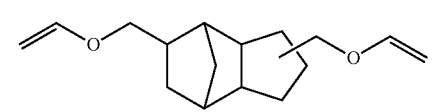
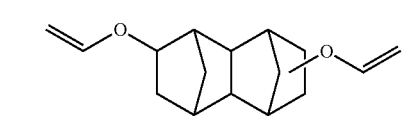
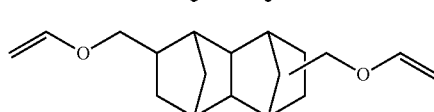
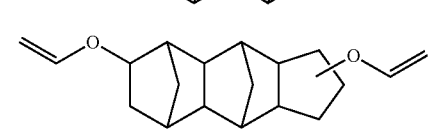
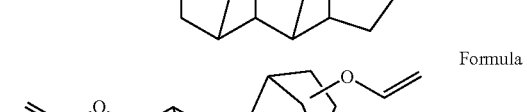

-continued
Formula (3)-18
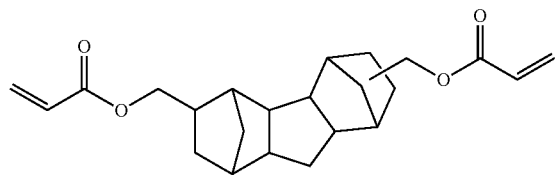
Formula (3)-19
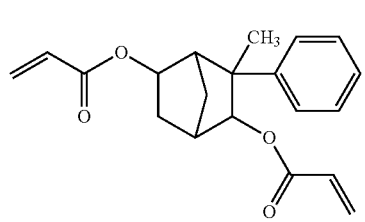
Formula (3)-20
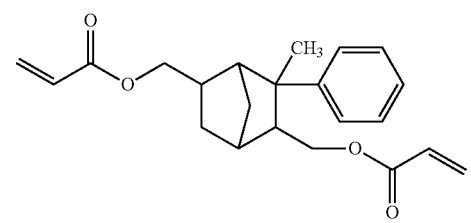
Formula (3)-21
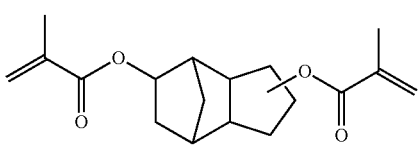
Formula (3)-22
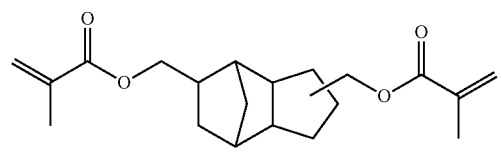
Formula (3)-23
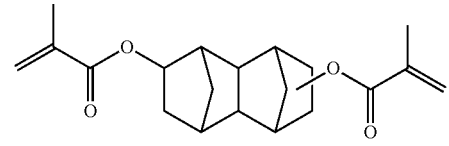
Formula (3)-24
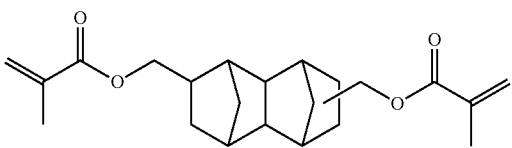
Formula (3)-25
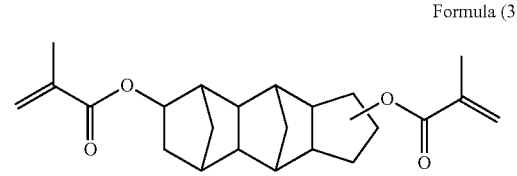
Formula (3)-26
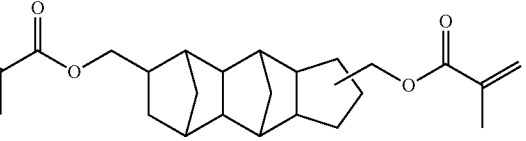
Formula (3)-27
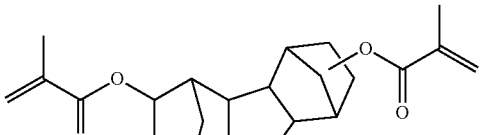
Formula (3)-28
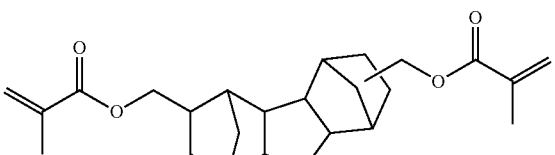
Formula (3)-29
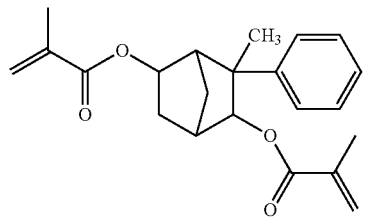
Formula (3)-30
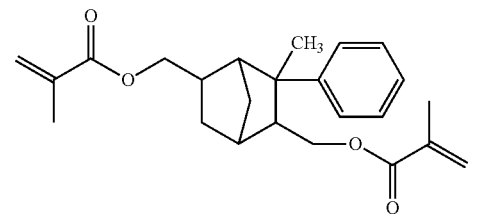
Formula (3)-31
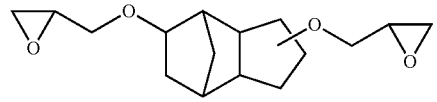
Formula (3)-32
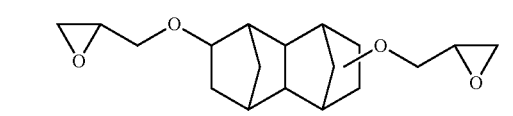
Formula (3)-33
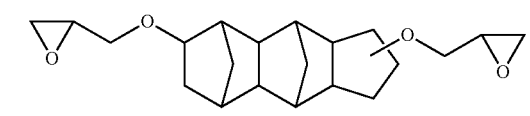
Formula (3)-34
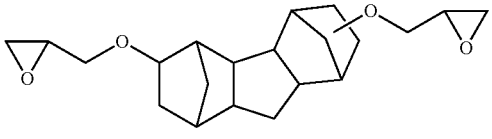

Formula (3)-35

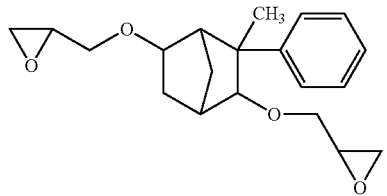

Among them, more preferred are compounds of the formulae (3)-1, (3)-2, (3)-3, (3)-4, (3)-5, (3)-6, (3)-7, (3)-8, (3)-11, (3)-12, (3)-13, (3)-14, (3)-15, (3)-16, (3)-17, (3)-18, (3)-21, (3)-22, (3)-23, (3)-24, (3)-25, (3)-26, (3)-27, (3)-28, (3)-31, (3)-32, (3)-33 and (3)-34.

The crosslink structure-containing cyclic hydrocarbon compounds of represented by the formula (3) may be used in combination of two or more.

In the hydrogenated bisphenol A compound represented by the formula (4), each of $R_8$ and $R_9$ which may be the same or different, is —O—CH=CH$_2$, —O—CH$_2$CH$_2$-β-CH=CH$_2$, —O—CO—CH=CH$_2$, —O—CO—C(CH$_3$)=CH$_2$, —O—CH$_2$CH$_2$—O—CO—CH=CH$_2$, —O—CH$_2$CH$_2$—O—CO—C(CH$_3$)=CH$_2$ or a glycidyl ether group. p is an integer of 0 or at least 1. Each of $R_8$ and $R_9$ is particularly preferably —O—CH=CH$_2$, —O—CH$_2$CH$_2$—O—CH=CH$_2$, —O—CO—CH=CH$_2$, —O—CO—C(CH$_3$)=CH$_2$ or a glycidyl ether group, and p is particularly preferably an integer of 0 or from 1 to 3.

Among them, more preferred are compounds represented by the following formulae.

Formula (4)-1

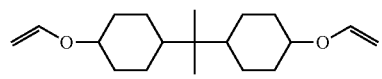

Formula (4)-2

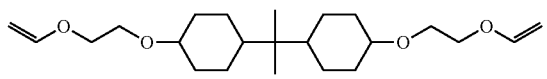

Formula (4)-3

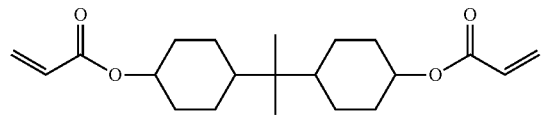

Formula (4)-4

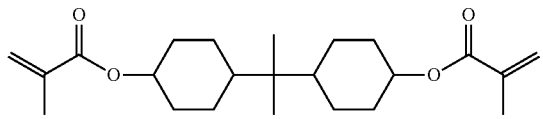

Formula (4)-5

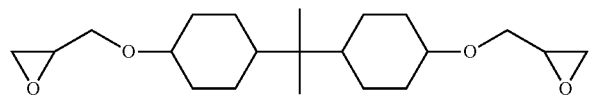

Formula (4)-6

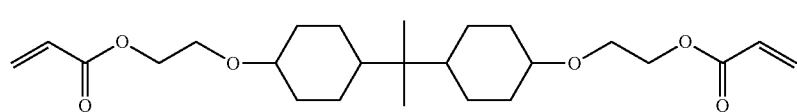

Formula (4)-7

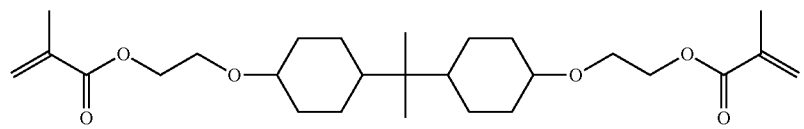

Formula (4)-8

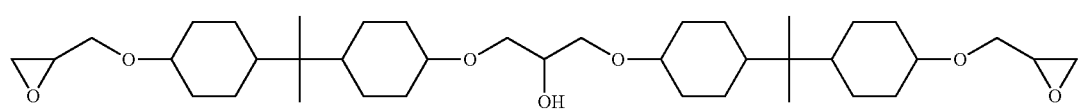

Formula (4)-9

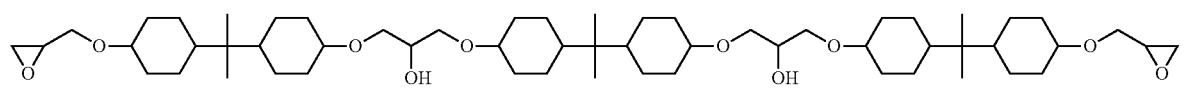

Among them, particularly preferred are compounds of the formulae (4)-1, (4)-3, (4)-4, (4)-5, (4)-8 and (4)-9.

The hydrogenated bisphenol A compounds represented by the formula (4) may be used in combination of two or more.

In the present invention, the content ratio of the photocurable monomer (A) represented by the formula (1) to the photocurable monomer (B) represented by the formula (2), (3) or (4) is, by the weight ratio of the photocurable monomer (A) to the photocurable monomer (B) (the weight of the photocurable monomer (A)/the weight of the photocurable monomer (B)), from 30/70 to 87/13, preferably from 35/65 to 85/15, more preferably from 40/60 to 80/20.

If the content of the photocurable monomer (A) represented by the formula (1) is too low, the improvement in the etch selectivity tends to be insufficient, such being unfavorable. On the other hand, if the content of the photocurable monomer (A) represented by the formula (1) is too high, or in a case where the photocurable monomer (A) alone is used, after application to a substrate, the photocurable monomer (A) component may be separated, or the thin film cannot be maintained, and the resin solution may be repelled, and no uniform thin membrane will be obtained, whereby pattern transfer failure may occur, such being unfavorable.

Further, within a range not to impair the present invention, a photocurable monomer (H) other than the photocurable monomer (A) may be contained. As the photocurable monomer (H), various monomers may be mentioned, and for example, by incorporating butanediol divinyl ether, octanediol divinyl ether, ethylene glycol divinyl ether, diethylene glycol divinyl ether, triethylene glycol divinyl ether, butanediol diacrylate, octanediol diacrylate, ethylene glycol diacrylate, diethylene glycol diacrylate, triethylene glycol diacrylate, butanediol dimethacrylate, octanediol dimethacrylate, ethylene glycol dimethacrylate, diethylene glycol dimethacrylate, triethylene glycol dimethacrylate or the like, flexibility can be imparted, and by incorporating cyclohexylene dimethanol divinyl ether, trimethylolpropane trivinyl ether, cyclohexylene dimethanol diacrylate, trimethylolpropane triacrylate, cyclohexylene dimethanol dimethacrylate, trimethylolpropane trimethacrylate or the like, the crosslink density will be improved, whereby the surface hardness can be improved. The blend amount may be suitably selected within a range not to impair the etching resistance and the adhesion to a substrate of the cured resin.

The photopolymerization initiator (C) to be used for the resin composition for photoimprinting of the present invention is preferably a photoradical polymerization initiator or a photocationic polymerization initiator, and either of them can be used without any restriction. The photocationic polymerization initiator may, for example, be an iodonium salt, a sulfonium salt or a phosphonium salt, and a known one may be used.

As the photoradical polymerization initiator, for example, commercially available initiators may be used. Example thereof include Irgacure (registered trademark) 2959 (1-[4-(2-hydroxyethoxy)phenyl]-2-hydroxy-2-methyl-1-propan-1-one), Irgacure (registered trademark) 184 (1-hydroxycyclohexyl phenyl ketone), Irgacure (registered trademark) 500 (1-hydroxycyclohexyl phenyl ketone, benzophenone), Irgacure (registered trademark) 651 (2,2-dimethoxy-1,2-diphenylethan-1-one), Irgacure (registered trademark) 369 (2-benzyl-2-dimethylamino-1-(4-morpholinophenyl)butanone-1), Irgacure (registered trademark) 907 (2-methyl-1[4-methylthiophenyl]-2-morpholinopropan-1-one), Irgacure (registered trademark) 379 (2-dimethylamino-2-(4-methyl-benzyl)-1-(4-morpholin-4-yl-phenyl)-butan-1-one), Irgacure (registered trademark) 819 (bis(2,4,6-trimethylbenzoyl)-phenylphosphine oxide), Irgacure (registered trademark) 1800 (bis(2,6-dimethoxybenzoyl)-2,4,4-trimethyl-pentylphosphine oxide, 1-hydroxy-cyclohexyl-phenyl-ketone), Irgacure (registered trademark) 1800 (bis(2,6-dimethoxybenzoyl)-2,4,4-trimethyl-pentylphosphine oxide, 2-hydroxy-2-methyl-1-phenyl-1-propan-1-one), Irgacure (registered trademark) OXE01 (1,2-octanedione, 1-[4-(phenylthio)phenyl]-2-(O-benzoyloxime)), Irgacure (registered trademark) OXE02 (ethanone, 1-[9-ethyl-6-(2-methylbenzoyl)-9H-carbazol-3-yl]-1-(O-acetyloxime)), Darocur (registered trademark) 1173 (2-hydroxy-2-methyl-1-phenyl-1-propan-1-one), Darocur (registered trademark) 1116, 1398, 1174 and 1020, Lucirin TPO (2,4,6-trimethylbenzoyldiphenylphosphine oxide) and Lucirin TPO-L (2,4,6-trimethylbenzoylphenylethoxyphosphine oxide) available from BASF Japan Ltd., and ESACURE 1001M (1-[4-benzoylphenylsulfanyl]phenyl)-2-methyl-2-(4-methylphenylsulfonyl)propan-1-one available from DKSH Japan K.K. Among them, Irgacure (registered trademark) 907 (2-methyl-1[4-methylthiophenyl]-2-morpholinopropan-1-one and Irgacure (registered trademark) 379 (2-dimethylamino-2-(4-methyl-benzyl)-1-(4-morpholin-4-yl-phenyl)-butan-1-one) are preferred.

The photocationic polymerization initiator may, for example, be bis(alkylphenyl)iodonium hexafluorophosphate, diphenyliodonium hexafluorophosphate, diphenyliodonium hexafluoroantimonate, bis(dodecylphenyl)iodonium tetrakis(pentafluorophenyl)borate, bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfide bistetrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonyl hexafluoroantimonate, triphenylsulfonium tetrafluoroborate, triphenylsulfonium tetrakis(pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bishexafluoroantimonate, bis[4-(di(4-(2-hydroxyethoxy))phenylsulfonio)phenyl]sulfide bistetrafluoroborate, or bis[4-(di(4-(2-hydroxyethoxy))phenylsulfonio)phenyl]sulfide tetrakis(pentafluorophenyl)borate. Among them, bis(alkylphenyl)iodonium hexafluorophosphate or diphenyliodonium hexafluorophosphate is preferred.

The photopolymerization initiators may be used alone or in combination of two or more. Further, considering the dispersion property with the composition, a solvent may be contained.

The content of the photopolymerization initiator (C) in the resin composition for photoimprinting of the present invention is preferably from 0.01 to 30 parts by weight, more preferably from 0.1 to 20 parts by weight, particularly preferably from 0.2 to 15 parts by weight per 100 parts by weight of the total weight of the photocurable monomer (A) and the photocurable monomer (B). Further, in order to improve the efficiency of such a photopolymerization initiator to accelerate photopolymerization, a known sensitizer or a dye may be contained. Particularly, a sensitizer is effective to improve the efficiency when a single wavelength light source is used.

The sensitizer may, for example, be anthracene, thioxanthone, benzophenone thioxanthone, phenothiazene or perylene. Further, the sensitizing dye may, for example, be a thiopyrylium salt type dye, a merocyanine type dye, a quinoline type dye, a styrylquinoline type dye, a ketocoumarin type dye, a thioxanthene type dye, a xanthene type dye, an oxonol type dye, a cyanine type dye, a rhodamine type dye or a pyrylium salt type dye. Among them, with an anthracene type sensitizer in combination with a photocationic polymerization initiator, the sensitivity will significantly be improved. As the anthracene compound, e.g. dibutoxyanthracene or dipropoxyanthracene (UVS-1331 or UVS-1221 manufactured by KAWASAKI KASEI CHEMICALS LTD.) is effective.

The resin composition for photoimprinting of the present invention preferably contains a viscosity-adjusting agent (D). The viscosity-adjusting agent (D) is used to adjust the viscosity of the composition when a thin film is formed from the composition and to adjust the coating property of the composition and the thickness of the obtainable thin film. As the viscosity-adjusting agent (D), a high molecular weight product such as a known thermoplastic resin, thermosetting resin or liquid resin may be used. Particularly, at least one high molecular weight product having a molecular weight (Mw (weight average molecular weight)) of from 1,000 to 1,000,000, more preferably from 2,000 to 500,000, further preferably from 3,000 to 300,000 is preferably contained. If the molecular weight (Mw) is too low, the effect of adjusting the viscosity may not sufficiently be obtained, the coating property may not be improved, or the change in the coating thickness may be small, such being unfavorable. On the other hand, if the molecular weight (Mw) is too high, the solubility tends to be poor, an insoluble matter may remain, or it tends to be difficult to control the viscosity since a change in the viscosity is significant even with a small amount, such being unfavorable. Several types of the viscosity-adjusting agents (D) may be used in combination in some cases.

The viscosity-adjusting agent (D) is not particularly limited but is more preferably a resin having an aromatic ring with favorable compatibility or a resin having a cyclic structure, and may, for example, be an ethylene/methylphenyl norbornene copolymer (for example, JP-A-2005-239975), an ethylene/norbornene/methylphenyl norbornene copolymer (for example, JP-A-2005-239975), polystyrene, polyvinylcarbazole, polyacenaphthylene, a tricyclodecane vinyl ether polymer (for example, JP-A-2005-113049), a 1-adamantyl vinyl ether polymer, a 2-adamantyl vinyl ether polymer, a methylphenyl norbornane vinyl ether polymer, a copolymer of ethylene/norbornene (for example, Topas manufactured by Ticona, or Apel manufactured by Mitsui Chemicals, Inc.), a hydrogenated product of a cyclic olefin ring-opening polymer (for example, ZEONEX or ZEONOR manufactured by ZEON CORPORATION), a hydrogenated product of a polar group-containing cyclic olefin ring-opening polymer (for example, ARTON manufactured by JSR Corporation), a carbazole skeleton-containing polymer or a fluorene skeleton-containing polymer.

Further, to improve the adhesion to a substrate, as the viscosity-adjusting agent (D), a resin containing hydroxy groups or a resin having hydroxy groups protected may also be suitably used. For example, polyhydroxystyrene, a styrene/hydroxystyrene copolymer, an acetal-protected polymer of a styrene/hydroxystyrene copolymer, a hydroxystyrene/tricyclodecane vinyl ether copolymer, an acetal-protected product of a hydroxystyrene/tricyclodecane vinyl ether copolymer, a block copolymer of hydroxystyrene/ethyl vinyl ether, or a random copolymer may, for example, be mentioned.

The above viscosity-adjusting agents (D) may be preferably used, and particularly preferred is an ethylene/methylphenyl norbornene copolymer, polyvinylcarbazole, polyacenaphthylene, a tricyclodecane vinyl ether polymer, a 1-adamantyl vinyl ether polymer, a 2-adamantyl vinyl ether polymer, a methylphenyl norbornane vinyl ether polymer, polyhydroxystyrene, a styrene/hydroxystyrene copolymer or its acetal-protected product, a carbazole skeleton-containing polymer or a fluorene skeleton-containing polymer.

Such viscosity-adjusting agents (D) may be used alone or in combination of two or more. The content of the viscosity-adjusting agent (D) in the resin composition is preferably from 0.1 to 100 parts by weight, more preferably from 0.5 to 50 parts by weight, particularly preferably from 0.5 to 30 parts by weight per 100 parts by weight of the photocurable monomer (A). If the content is too low, no sufficient effect of adjusting the viscosity may be obtained, the coating property may not be improved, or the change in the resin thickness may be small, such being unfavorable. On the other hand, if the content is too high, an insoluble matter may remain, solubility of other components may be decreased, the coating property of the resin may be impaired, or photocuring will hardly occur, such being unfavorable.

As a method of forming the thin film using the resin composition for photoimprinting of the present invention, a known method such as a spin coating method, a solution casting method, a dipping method or a dropping method may be suitably used. The thickness of the thin film of the resin for photoimprinting comprising the resin composition for photoimprinting of the present invention may optionally be adjusted by the viscosity adjustment by the viscosity-adjusting agent (D), or by the viscosity of the resin composition by dilution with a solvent (G). The film thickness before curing with which favorable film forming property and in-plane uniformity suitable for photoimprinting can be achieved, is preferably from 10 nm to 40 μm, more preferably from 15 nm to 30 μm.

As a supporting substrate to which the resin composition is applied when the thin film is to be formed, a substrate at least the surface of which comprises silicon, aluminum, copper, sapphire, $SiO_2$ (silicon oxide), SiC (silicon carbide), GaN (gallium nitride), InGaN (indium gallium nitride), GaAs (gallium arsenide), AlGaAs (aluminum gallium arsenide), AlGaP (aluminum gallium phosphide), ITO (indium tin oxide), glass, a resin film or the like may optionally be used.

In a case where a resin thin film capable of photoimprinting is to be formed, the amount of a remaining volatile component in the thin film is preferably small. If a large amount of a remaining volatile component is present, bubbling or the like may be confirmed on the resin thin film at the time of photoimprinting, whereby the pattern transfer accuracy will be lowered.

For formation of the resin thin film from the resin composition for photoimprinting of the present invention, as mentioned above, preferably a solvent (G) is used. The solvent (G) may optionally be used so long as it dissolves the composition, and preferred is an organic solvent. For example, as a ketone solvent, cyclohexanone, cyclopentanone, methyl ethyl ketone, methyl isobutyl ketone or the like may be mentioned, as an ester solvent, ethylene glycol monomethyl ether acetate, diethylene glycol monomethyl ether monoacetate, diethylene glycol monoethyl ether monoacetate, triethylene glycol monoethyl ether monoacetate, diethylene glycol monobutyl ether monoacetate, propylene glycol monomethyl ether acetate, butylene glycol monomethyl ether acetate or the like may be mentioned, and as an aromatic hydrocarbon solvent, toluene, xylene, mesitylene, chlorobenzene, ethylbenzene, diethylbenzene or the like may be mentioned. Among them, xylene, cyclohexanone or propylene glycol monomethyl ether acetate is preferred.

Such solvents (G) may be used alone or in combination of two or more. When the solvent (G) is added to the resin composition, it may be properly heated to dissolve the resin. The solvent (G) may optionally be prepared depending upon the thickness of the thin film to be formed. The solvent (G) with which favorable film forming property and in-plane uniformity suitable for photoimprinting can be achieved is contained in an amount of preferably from 0.5 to 30,000 parts by weight, more preferably from 1.0 to 25,000 parts by weight per 100 parts by weight of the total weight of the photocurable monomer (A) and the photocurable monomer (B). If the solvent content is too low, the viscosity tends to be high, the resin will hardly be uniformly spread, and no uniform film thickness may be obtained in some cases, such being unfavorable. On the other hand, if the solvent content is too high, the film tends to be too thin, the surface area is relatively large to the volume, and the film state may not be maintained by the surface tension, or the solvent is likely to remain in the resin, such being unfavorable.

By film formation by the spin coating method, the solvent evaporation rate will be improved by the airflow by high speed revolution, and the solvent can be evaporated during spin coating, whereby a resin thin film with a small amount of the remaining volatile component applicable to photoimprinting will be obtained. The boiling point of the solvent to be used for spin coating is preferably from 70° C. to 250° C. in order to secure the in-plane uniformity of the film formed by spin coating, however, a solvent having a boiling point lower than the boiling point of the photocurable monomer (A) to be used may suitably be used. Further, in order to further reduce the remaining volatile component in the thin film, after spin coating, drying by heating may be carried out e.g. by a hotplate, a hot air dryer or a vacuum dryer, to obtain a thin film of the resin for photoimprinting. In such a case, the hot air drying temperature is preferably lower than the boiling point of the photocurable monomer (A) to be used. On the other hand, by the solution casting method, the dipping method, the dropping method or the like, it tends to be difficult to evaporate the solvent at the time of coating, and accordingly if a solvent is used, air drying or thermal drying step after coating will be required. As a film thickness with which the remaining volatile component in the thin film can be reduced, the thickness of the thin film to be formed is more preferably at most 40 μm before curing.

In a case where the thin film is formed from the resin composition for photoimprinting of the present invention, a leveling agent may be blended. As the leveling agent, known one may be used, and preferred is a silicone type compound, a fluorine type compound, an acrylic type compound, or an acrylic/silicone type compound. The silicone type compound may, for example, be DISPARLON 1761 or DISPARLON 1711EF manufactured by Kusumoto Chemicals Ltd., the fluorine type compound may, for example, be MEGAFAC F-470 or F-470 manufactured by Dainippon Ink and Chemicals, the acrylic type compound may, for example, be DISPARLON LF-1980 or LF-1982, and the acrylic/silicone type compound may, for example, be DISPARLON UVX-270 or UVX-271.

The amount of addition of the leveling agent is selected within a range not to impair the etching resistance and the adhesion to a substrate.

Further, in the resin composition for photoimprinting of the present invention, as the case requires, an antifoaming agent, an antioxidant, a heat-resistant stabilizer, a weather-resistant stabilizer, a light stabilizer or the like may be incorporated. Further, as an adhesion-imparting agent to improve the adhesion to a substrate, a compound having a hydroxy group such as bisphenol A, hydrogenated bisphenol A, 1-adamantyl alcohol, 2-adamantyl alcohol or tricyclodecanol may be incorporated. A known compound may be suitably used with a blend amount within a range not to impair the function of the resin composition such as the etching resistance.

In photoimprinting, the resin composition may be used as it is, however, it is preferably subjected to filtration using a known method so as to remove particulate substances by foreign matters from the viewpoint of improvement in the transfer accuracy. It is possible to properly change the material of the filter depending upon the type of the resin composition to be used. Further, a filter having no charge trapping function may also be suitably used. The filter pore size is particularly preferably at most 0.45 μm.

The resin composition for photoimprinting of the present invention is cured by irradiation with ultraviolet light or the like, and the irradiation conditions may properly be changed depending upon the type and the compositional ratio of the resin composition, the film thickness and the like. As the wavelength of the ultraviolet light to be applied, a light source having a wavelength with a high sensitivity may properly be selected depending upon the type of the photopolymerization initiator and the sensitizer, and the like. The ultraviolet light irradiation light source may, for example, be a high pressure mercury lamp, an ultrahigh pressure mercury lamp, a xenon lamp, a metal halide lamp, an LED lamp, solar light, or a carbon arc lamp. Further, as the active energy ray, in addition to ultraviolet light, for example, visible light, infrared light, X-ray, α-ray, β-ray, γ-ray or electron beam may be used.

Further, during irradiation with active energy ray such as ultraviolet light at the time of photoimprinting, or after release from the mold after irradiation, the resin may be heated as the case requires. By heating, unreacted products in the cured resin can be reduced, and the curing property of the resin and the adhesion to a supporting substrate can be improved. The heating temperature is usually preferably from 30 to 100° C., and is more preferably lower than the resin glass transition temperature after curing. Further, post-UV curing is also applicable, comprising further irradiating the cured film after irradiated with ultraviolet light and released from the mold, with ultraviolet light thereby to increase the resin curing ratio. The film thickness of the cured film obtainable by curing the resin composition for photoimprinting of the present invention is preferably from 10 nm to 40 μm, more preferably from 15 nm to 30 μm. If the film thickness is less than 10 nm, the surface area is relatively large to the volume, whereby the film state cannot be maintained by the surface tension in some cases, such being unfavorable. On the other hand, if the film thickness exceeds 40 μm, light is less likely to reach the interior, and the internal curing property may be insufficient in some cases, such being unfavorable.

With the resin composition for photoimprinting of the present invention, a fine structure can be formed on a substrate by a known photoimprinting method. The obtained fine structure can be utilized for microfabrication of a substrate as an etching mask.

The pattern forming process of the present invention in the photoimprinting method preferably comprises the following steps.

(1) A step of applying the resin composition for photoimprinting to a substrate to form a coating film, (2) A step of bringing a pattern surface of a mold having a desired pattern into contact with the surface of the formed coating film and pressurizing them to fill the space in the pattern with the resin composition, (3) A step of curing the resin composition in the space in the pattern by light irradiation, (4) A step of separating the mold from the cured resin composition, and (5) A step of etching the substrate using the formed fine structure as a mask.

As an apparatus to carry out photoimprinting, various apparatus is available on the market, and a proper apparatus can be selected. In order to realize a process with excellent pattern transfer accuracy and with improved productivity, imprinting conditions under which the mold pressure is low and the mold time is short are preferred. Further, in a case where a mold is brought into contact with the resin surface in the air, depending upon the pattern size, the shape or the resin viscosity, pattern defects by inclusion of air bubbles may occur. Further, moisture or oxygen in the air may inhibit the photopolymerization, thus leading to insufficient curing of the resin in some cases. Accordingly, as the case requires, a photoimprinting method under reduced pressure may also be applicable in which the pressure in the apparatus system is reduced, and under reduced pressure, the mold is brought into contact with the resin surface and they are pressurized to photocure the resin. Further, the atmosphere in the apparatus system may be replaced with an inert gas, dry air or another gas which will not inhibit curing of the resin, to carry out photoimprinting.

The etching mask of the present invention is a fine structure having a predetermined pattern formed on a substrate by a photoimprinting method using the resin composition for photoimprinting of the present invention, and by etching the substrate provided with the etching mask, a predetermined pattern can be formed on the substrate main body. In order to quickly carry out patterning on the substrate by etching, the residual layer (the resin remaining at the bottom of the concave of the pattern) on the pattern formed on the etching mask is preferably thin.

As etching, a common process such as dry etching such as physical etching or chemical etching, or wet etching, may be applicable. For example, reactive ion etching may be employed. Further, the resin film remaining after etching may be removed by a solvent which dissolves the resin or by a treatment such as ashing.

As applications of photoimprinting products using the resin composition for photoimprinting of the present invention, environment-conscious fields of an LED, an organic EL and a solar panel, photo devices such as an optical waveguide, a light-guiding plate or a diffraction grating, biodevice fields such as biochips, fluidic devices such as a microchannel and a micro reactor, data storage media and wiring boards may be mentioned.

EXAMPLES

Now, the present invention will be described in detail with reference to Examples. However, it should be understood that the present invention is by no means restricted to such specific Examples.

A: Method for Preparing Resin Composition for Photoimprinting and Method for Measuring Viscosity Examples 1 to 23 and Comparative Examples 1 to 19

Resin compositions for photoimprinting in Examples 1 to 23 and Comparative Examples 1 to 18 were prepared by using a photocurable monomer (A), a photocurable monomer (B), a photopolymerization initiator (C), a viscosity-adjusting agent (D), a sensitizer (E), a leveling agent (F), a solvent (G) and a photocurable monomer (H) as identified in Tables 1 and 2. In Comparative Example 19, not a resin composition for photoimprinting but a polymer solution was prepared, and its preparation method is separately shown below.

In Tables 1 and 2, the values for the photopolymerization initiator (C), the viscosity-adjusting agent (D), the sensitizer (E), the leveling agent (F) and the solvent (G) are contents (parts by weight) per 100 parts by weight of the photocurable monomer (A) and the photocurable monomer (B) in total, or to the photocurable monomer (H).

Preparation of the respective compositions and the viscosity measurement were carried out in a yellow room under a fluorescent lamp from which ultraviolet light having a wavelength of at most 500 nm was shielded, in the following procedure.

1. Into a predetermined glass container, the photocurable monomer (A), the photocurable monomer (B), the photocurable monomer (H) and the photopolymerization initiator (C), and as the case requires, the viscosity-adjusting agent (D), the sensitizer (E), the leveling agent (F) and the solvent (G) were weighed in proportions as identified in Tables 1 and 2, and mixed with stirring.

2. The mixture was subjected to filtration through a 0.45 μm nylon filter (LifeASSURE manufactured by Sumitomo 3M Limited) to prepare a resin composition for photoimprinting.

In Comparative Example 19, solvent (G-1: cyclohexanone) was weighed in a proportion as identified in Table 2 per 100 parts by weight of viscosity-adjusting agent (D-3: poly(9-vinylcarbazole)) which is a polymer of photocurable monomer (A-1: N-vinylcarbazole) as identified in Table 2, and they were mixed with stirring. Then, the mixture was subjected to filtration through a 0.45 μm nylon filter (LifeASSURE manufactured by Sumitomo 3M Limited) to prepare a poly(9-vinylcarbazole) solution.

The respective components disclosed in Tables 1 and 2 are shown below. In Table 3, the classifications, the abbreviations and the names of the respective components are shown.

Photocurable Monomer (A)
A-1: N-Vinylcarbazole (manufactured by Maruzen Petrochemical Co., Ltd.)
Photocurable Monomer (B)
B-1: Bisarylfluorene compound (manufactured by Osaka Gas Chemicals Co., Ltd., product name: OGSOL EA-0200)
B-2: 9,9-Bis[4-(2-acryloyloxyethoxy)phenyl]fluorene (manufactured by SHIN-NAKAMURA CHEMICAL CO., LTD., product name: A-BPEF)
B-3: Tricyclodecanedimethanol divinyl ether (manufactured by Maruzen Petrochemical Co., Ltd.)
B-4: Pentacyclopentadecanedimethanol divinyl ether (manufactured by Maruzen Petrochemical Co., Ltd.)
B-5: Tricyclodecanedimethanol diacrylate (manufactured by SHIN-NAKAMURA CHEMICAL CO., LTD., product name: A-DCP)
B-6: Hydrogenated bisphenol A divinyl ether (manufactured by Maruzen Petrochemical Co., Ltd.)
B-7: Epoxy resin jER, grade YX8000 (manufactured by Mitsubishi Chemical Corporation)
B-8: Epoxy resin jER, grade YX8034 (manufactured by Mitsubishi Chemical Corporation)
B-9: 9,9-Bis[4-(2-vinyl ether ethoxy)phenyl]fluorene (manufactured by Maruzen Petrochemical Co., Ltd.)
Photopolymerization Initiator (C)
C-1: 2-Methyl-1-[4-(methylthio)phenyl]-2-morpholinopropan-1-one (Irgacure 907 manufactured by BASF Japan Ltd.)
C-2: 2-Dimethylamino-2-(4-methyl-benzyl)-1-(4-mopholin-4-yl-phenyl)-butan-1-one (Irgacure 379 manufactured by BASF Japan Ltd.)

C-3: Bis(alkylphenyl)iodonium hexafluorophosphate 50 wt % propylene carbonate solution (WPI-113 manufactured by Wako Pure Chemical Industries, Ltd.)

C-4: 2,2-Dimethoxy-1,2-diphenylethan-1-one (Irgacure 651 manufactured by BASF Japan Ltd.)

Viscosity-Adjusting Agent (D)

The weight average molecular weight (Mw) of resin D-1 used for the viscosity-adjusting agent (D) was measured by gel permeation chromatography (GPC) using a GPC apparatus manufactured by Waters under conditions of column: Shodex K-805L/K-806L, column temperature: 40° C., solvent: chloroform and flow rate: 0.8 mL/min.

The weight average molecular weight (Mw) of resin D-2 used for the viscosity-adjusting agent (D) was measured by using a GPC apparatus manufactured by TOSOH CORPORATION under conditions of column: TSK G2000H×two columns/TSK G3000H/TSK G4000H manufactured by TOSOH CORPORATION, column temperature: 40° C., solvent: THF and flow rate: 1.0 mL/min.

D-1: Ethylene/5-methyl-5-phenyl-bicyclo[2,2,1]hept-2-ene copolymer (Mw: 50,000, ethylene/methylphenyl norbornene copolymer disclosed in JP-A-2005-239975)

D-2: Polyhydroxystyrene (MARUKA LYNCUR M S-2 manufactured by Maruzen Petrochemical Co., Ltd., Mw: 4,000 to 6,000)

D-3: Poly(9-vinylcarbazole) (reagent manufactured by Sigma-Aldrich, number average molecular weight (Mn): 25,000 to 50,000, Mw/Mn=about 2)

Sensitizer (E)

E-1: 9,10-Dipropoxyanthracene (UVS-1221 manufactured by KAWASAKI KASEI CHEMICALS LTD.)

Leveling Agent (F)

F-1: Silicone type leveling agent (DISPARLON 1761 manufactured by Kusumoto Chemicals Ltd.)

Solvent (G)

G-1: Cyclohexanone (manufactured by Wako Pure Chemical Industries, Ltd.)

Photocurable Monomer (H)

H-1: Tricyclodecane vinyl ether (manufactured by Maruzen Petrochemical Co., Ltd.)

H-2: 1-Adamantyl vinyl ether (manufactured by Maruzen Petrochemical Co., Ltd.)

H-3: Tripropylene glycol diacrylate (manufactured by SHIN-NAKAMURA CHEMICAL CO., LTD., product name: APG-200)

H-4: Trimethylolpropane triacrylate (manufactured by SHIN-NAKAMURA CHEMICAL CO., LTD., product name: A-TMPT)

H-5: N-Vinyl-2-pyrrolidone (manufactured by Wako Pure Chemical Industries, Ltd.)

The solvent was removed by a vacuum drier from each of the resin compositions for photoimprinting in Examples 3, 4, 9, 19 and 20 and Comparative Examples 7 and 9 prepared by the above method, and the viscosity in a state where no solvent was contained was measured by BROOKFIELD programmable digital viscometer (model: DV-II+). The liquid temperature at the time of measurement and the viscosity measurement results are shown in Tables 1 and 2.

B: Preparation of Resin Thin Film

The resin compositions in Examples and Comparative Examples and the resin solution were applied by the following spin coating method.

As the substrate, a 2 inch Si wafer (manufactured by ELECTRONICS AND MATERIALS CORPORATION LIMITED, plane direction: 1.0.0) stored in a dry chamber under a relative humidity of at most 25% for at least 24 hours was used.

In Examples 1 to 23 and Comparative Examples 1 to 19, the 2 inch Si wafer was placed on a spin coater (SC-308H manufactured by EHC) and fixed by vacuum contact. Then, 0.4 ml of the resin composition for photoimprinting or the resin solution was placed around the center of the substrate, followed by spin coating under spin coating conditions as identified in Tables 1 and 2, to prepare a thin film of the resin for photoimprinting or a poly(9-vinylcarbazole) thin film.

C: Method of Curing Resin Thin Film

Among the resin films prepared as above, thin films in Examples 1 to 11 and 14 and Comparative Examples 1 to 5, 8, 13, 14, 16 and 18 were irradiated with UV in a nitrogen atmosphere, and the thin films in Examples 12, 13 and 15 to 23 and Comparative Examples 6, 7, 9 to 12, 15 and 17 were irradiated with UV in dry air with a relative humidity of at most 2.0%.

As the UV light source, a high pressure mercury lamp (represented as "Hg" in Tables 1 and 2) was used in Examples 1, 3 and 21 to 23 and Comparative Examples 2, 4, 8, 16 and 18, and an LED lamp (EXECURE-H-1VC manufactured by HOYA CORPORATION, represented as "LED" in Tables 1 and 2) with a wavelength of 365 nm was used in Examples 2 and 4 to 20 and Comparative Examples 3, 5 to 7, 9 to 12 and 14, and each thin film was irradiated with ultraviolet light with an illuminance of 50 mW/cm$^2$ with a UV irradiation amount as identified in Tables 1 and 2 to cure the resin. In Comparative Examples 1, 13, 15 and 17, the following film stability was poor and no uniform thin film could be obtained, and accordingly no curing was conducted. In Comparative Examples 3 and 5, although the film stability was favorable, curing did not sufficiently proceed under the curing conditions as identified in Table 2 and the film was tacky, and accordingly the following film thickness measurement and evaluation of Si etch selectivity were not conducted.

Further, in Comparative Example 19, since a poly(9-vinylcarbazole) thin film was formed, no UV curing was conducted, and after formation of the thin film, the thin film was dried in a vacuum oven at 150° C. in vacuum for 30 minutes to obtain a uniform resin thin film.

D. Evaluation of Resin Thin Film

Of each of the resin thin films prepared from the resin compositions for photoimprinting, "film stability and volatility before photocuring" were evaluated, and "film thickness" was measured when a uniform cured film was obtained. Further, of the cured film formed on the Si substrate, "Si etch selectivity" was evaluated from the etching rate by the Si etching conditions. The results are shown in Tables 1 and 2.

(Film Stability and Volatility Before Photocuring)

The surface state after the curable composition was applied to the Si substrate by spin coating was observed, and whether a uniform coating film was formed was observed and evaluated on the basis of the following standards.

o: The thin film was formed on the 2 inch Si substrate by spin coating, and 5 minutes later, no repelling of the film and precipitation of solid content occurred, the reduction of the film thickness by volatilization of the photocurable monomer was 5% or lower, and a uniform coating film was obtained.

x: The thin film was formed on the 2 inch Si substrate by spin coating, and 5 minutes later, repelling of the film or precipitation of solid content occurred, or a significant reduction (5% or more) of the film thickness by volatilization of the photocurable monomer was observed.

(Film Thickness)

With respect to the samples rated as o in evaluation of the coating property, after UV curing, the film thickness of the cured film and the thickness of the poly(9-vinylcarbazole) thin film after vacuum drying in Comparative Example 19 were measured. The film thickness of each of the thin films in Examples 1 to 23 and Comparative Examples 2, 4, 6 to 12, 14, 16, 18 and 19 was measured by a reflection film thickness meter (FE-3000 manufactured by Otsuka Electronics Co., Ltd.)

(Si Etch Selectivity)

Each of the thin films formed on the Si substrate in Examples 1 to 23 and Comparative Examples 2, 4, 6 to 12, 14, 16, 18 and 19 was evaluated by the following method.

Part of the surface of the prepared resin cured film was masked with a polyimide pressure sensitive adhesive tape to prepare a sample. Then, the sample was subjected to etching using a dry etcher under conventional Si etching conditions using fluorine-containing gases. The masking tape was removed, and the difference in the level between the treated surface and the non-treated surface was measured to determine the etching rate. Further, from the etching rate of the Si substrate etched under the same conditions, the Si etch selectivity=Si etching rate/resin etching rate was evaluated.

It was found from the results shown in Tables 1 and 2, the thin film obtained from the composition for photoimprinting of the present invention had favorable film stability before curing, and further was excellent in the etching resistance since the Si etch selectivity of the cured product obtained from the composition for photoimprinting of the present invention was higher than the Si etch selectivity of a cured product or a polymer (Comparative Examples 2 to 12, 19) obtained from the composition of the photocurable monomer (A) by itself or the photocurable monomer (B) by itself.

On the other hand, as shown in Table 2, with the composition of the photocurable monomer (A) by itself, the composition of which the ratio of the photocurable monomer (A) and the photocurable monomer (B) was out of the range of the present invention or the composition for which two types of the photocurable monomer (B) were used (Comparative Examples 1 and 13 to 16), the film stability was poor, no thin film was favorably formed on the substrate, or the Si etch selectivity was low. Further, in Comparative Examples 17 and 18 in which a conventional composition was used, the film stability was poor, the film thickness was significantly reduced, or the Si etch selectivity was low.

E: Preparation of Fine Structure by Photoimprinting

Now, Examples for preparation of fine structure by photoimprinting are shown in Examples 24 to 27. For preparation of the fine structure, a transparent resin mold was used.

Specifically, a resin film which had a fine pattern transferred by thermal nanoimprinting on a film of "ZF-14", tradename, manufactured by Optes Inc. by using molds of various patterns, and which was subjected to surface treatment, was used as a transparent resin mold.

First, on the resin film, each mold was disposed so that the surface on which a fine pattern was formed was in contact with the resin film, and then set on a press stage of a thermal nanoimprinting apparatus "VX-2000" manufactured by SCIVAX Corporation. Then, the above mold was pressed against the resin film (thermoplastic resin (1) (ZF-14)) under conditions of pressing plate temperature: 170° C., press stage temperature: 170° C., pressure: 1.5 MPa, pressure-retention time: 60 seconds and cooling temperature: 100° C., to carry out imprinting. Then, the pressure was reduced, the resin film and the mold were taken out from the press stage, and the resin film was released from the mold, thereby to obtain a film having a reverse shape of the fine shape of the mold transferred.

The resin film having the fine pattern formed thereon was subjected to a hydrophilic treatment. The hydrophilic treatment was carried out by UV ozone treatment. For the UV ozone treatment, using an UV ozone cleaning apparatus "OC-2506 (provided with ozone decomposition apparatus OCA-150L-D)" manufactured by EYE GRAPHICS CO., LTD., using a low pressure mercury lamp, the resin mold was irradiated with UV in the presence of ozone with an irradiation distance of 10 mm for a UV ozone treatment time of 300 seconds. The evacuation time in the UV ozone cleaning apparatus was 2 minutes. After the hydrophilic treatment, to the fine shape surface (UV-irradiated surface) which was the surface of the resin mold, a release agent "OPTOOL DSX" manufactured by DAIKIN INDUSTRIES, LTD. was dropped and applied over the entire surface. Then, after air drying, the resin mold was baked on a hotplate at 100° C. for 15 minutes. After baking, the surplus release agent was washed away with a fluorine-containing solvent "DEMNUM SOLVENT (manufactured by DAIKIN INDUSTRIES, LTD.)" and removed to obtain a transparent resin mold.

On the transparent resin mold used in Example 24, a circular pillar pattern with a height of 188 nm and a diameter of 237 nm is formed.

On the transparent resin mold used in Examples 25 and 27, a circular hole pattern with a depth of 375 nm and a diameter of 210 nm is formed.

On the transparent resin mold used in Example 26, a hexagonal hole pattern with a depth of 1.0 µm and a diameter of 5.0 µm is formed (the diameter of this pattern represents the length of the diagonal between corners of the hexagon).

Example 24

Using the resin composition for photoimprinting as identified in Table 4, a fine structure was formed on the Si substrate by the following method.

The resin composition was applied to the 2 inch Si substrate by spin coating under conditions as identified in Table 4 to obtain a resin thin film having a film thickness of 157 nm. The transparent resin mold having a circular pillar pattern with a height of 188 nm and a diameter of 237 nm formed thereon was placed so that the surface on which the fine pattern was formed was in contact with the resin thin film, and the Si substrate and the transparent resin mold were placed on a press stage of a heat pressing machine "AH-1T" (manufactured by AS ONE Corporation). Then, the transparent resin mold was pressed against the surface of the resin thin film at a press plate temperature of room temperature, at a press stage temperature of room temperature under a pressure of 2.2 MPa and held for 10 seconds to fill the space in the pattern with the resin. Then, the pressure was reduced, and the Si substrate and the transparent resin mold were taken out from the press stage. Then, the resin was irradiated with ultraviolet light (irradiation amount: 860 mJ/cm$^2$) through the transparent resin mold using a LED lamp with a wavelength of 365 nm with an illuminance of 20 mW/cm$^2$ for 43 seconds and cured. The transparent resin mold was released from the surface of the cured resin to form a fine structure on the Si substrate.

With respect to the obtained fine structure on the Si substrate, the fine pattern shape was observed by using a field emission scanning electron microscope (FE-SEM) (model "JSM-6700F") manufactured by JEOL Ltd. A SEM image of the obtained fine structure is shown in FIG. 1.

Examples 25 and 27

Figure 2:
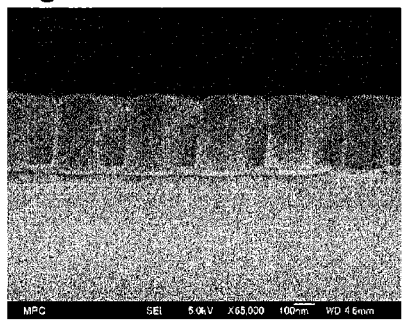
FIG. 2 is a SEM image of a transfer pattern of a fine structure by photoimprinting in Example 25.
Figure 4:
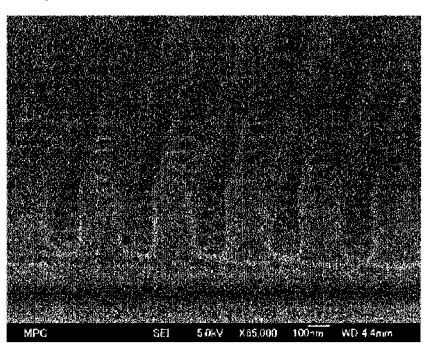
FIG. 4 is a SEM image of a transfer pattern of a fine structure by photoimprinting in Example 27.

A fine structure was formed on the Si substrate in the same manner as in Example 24 except that the resin composition for photoimprinting as identified in Table 4 was used, and that a transparent resin mold having a circular hole pattern with a depth of 375 nm and a diameter of 210 nm formed thereon was used. SEM images of the obtained fine structure are shown in FIGS. 2 and 4.

Example 26

Figure 3:
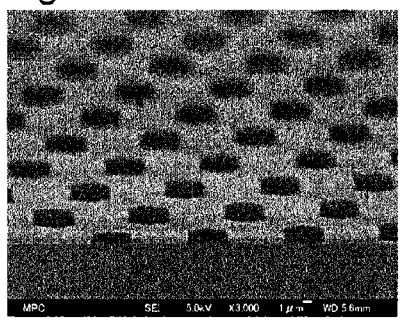
FIG. 3 is a SEM image of a transfer pattern of a fine structure by photoimprinting in Example 26.

A fine structure was formed on the Si substrate in the same manner as in Example 24 except that the resin composition for photoimprinting as identified in Table 4 was used, and that a transparent resin mold having a hexagonal hole pattern with a depth of 1.0 μm and a diameter of 5.0 μm formed thereon was used. A SEM image of the obtained fine structure is shown in FIG. 3.

Comparative Example 20

A fine structure formation test was carried out on the Si substrate in the same manner as in Example 24 except that the resin thin film as identified in Table 4 was used and that a transparent resin mold having a circular hole pattern with a depth of 375 nm and a diameter of 210 nm formed thereon was used.

F: Evaluation of Pattern Transfer Property of Fine Structure

The fine structure on the Si substrate obtained in each of Examples 24 to 27 and Comparative Example 20 was evaluated on the basis of evaluation standards: the transfer property ○: the proportion of the area at which the fine pattern could not be released from the transparent resin mold by UV imprinting, and the fine pattern was separated from the Si substrate, or the fine pattern was broken, was at most 5%, and the transfer property x: the fine pattern was broken, and the resin could not be released from the mold, and 5% or more thereof was broken, or the fine shape could not be transferred, and the fine structure could not be formed. The results are shown in Table 4.

In Examples 24 to 27, as shown in FIGS. 1 to 4 (SEM photographs), the fine pattern was transferred, and the fine pattern was not substantially broken, thus indicating favorable transfer property. In Comparative Example 20, the fine pattern could not be transferred at all, and it was found that the fine pattern could not be transferred on the poly(9-vinylcarbazole) thin film by UVNIL.

TABLE 1

|  | Ex. 1 | | Ex. 2 | | Ex. 3 | | Ex. 4 | |
| --- | --- | --- | --- | --- | --- | --- | --- | --- |
|  | Type | Amount | Type | Amount | Type | Amount | Type | Amount |
| Photocurable monomer (A) | A-1 | 50 | A-1 | 50 | A-1 | 50 | A-1 | 50 |
| Photocurable monomer (B) | B-1 | 50 | B-1 | 50 | B-1 | 50 | B-1 | 50 |
| Photopolymerization initiator (C) | C-1 | 10 | C-1 | 10 | C-2 | 10 | C-2 | 10 |
| Viscosity-adjusting agent (D) | | | | | | | | |
| Sensitizer (E) | | | | | | | | |
| Leveling agent (F) | | | | | | | | |
| Viscosity without solvent | | | | | 2,088 mP·s (25° C.) | | 2,088 mP·s (25° C.) | |
| Solvent (G) | G-1 | 348 | G-1 | 348 | G-1 | 348 | G-1 | 348 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 531 nm | | 531 nm | | 525 nm | | 525 nm | |
| UV light source | Hg | | LED | | Hg | | LED | |
| UV irradiation amount | 750 mJ | | 750 mJ | | 750 mJ | | 750 mJ | |
| Si etch selectivity | 2.23 | | 2.40 | | 2.23 | | 2.28 | |
|  | Ex. 5 | | Ex. 6 | | Ex. 7 | | Ex. 8 | |
|  | Type | Amount | Type | Amount | Type | Amount | Type | Amount |
| Photocurable monomer (A) | A-1 | 85 | A-1 | 80 | A-1 | 70 | A-1 | 30 |
| Photocurable monomer (B) | B-1 | 15 | B-1 | 20 | B-1 | 30 | B-1 | 70 |
| Photopolymerization initiator (C) | C-2 | 10 | C-2 | 10 | C-2 | 10 | C-2 | 5 |
| Viscosity-adjusting agent (D) | | | | | | | | |
| Sensitizer (E) | | | | | | | | |
| Leveling agent (F) | | | | | | | | |
| Viscosity without solvent | | | | | | | | |
| Solvent (G) | G-1 | 330 | G-1 | 330 | G-1 | 330 | G-1 | 383 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 510 nm | | 515 nm | | 518 nm | | 490 nm | |
| UV light source | LED | | LED | | LED | | LED | |
| UV irradiation amount | 750 mJ | | 750 mJ | | 750 mJ | | 750 mJ | |
| Si etch selectivity | 2.50 | | 2.69 | | 2.83 | | 2.12 | |
|  | Ex. 9 | | Ex. 10 | | Ex. 11 | | Ex. 12 | |
|  | Type | Amount | Type | Amount | Type | Amount | Type | Amount |
| Photocurable monomer (A) | A-1 | 70 | A-1 | 70 | A-1 | 50 | A-1 | 50 |
| Photocurable monomer (B) | B-1 | 30 | B-1 | 30 | B-2 | 50 | B-3 | 50 |
| Photopolymerization initiator (C) | C-2 | 10 | C-2 | 10 | C-1 | 10 | C-3 | 5 |
| Viscosity-adjusting agent (D) | D-3 | 11.5 | D-3 | 50 | D-1 | 1 | | |
| Sensitizer (E) | | | | | | | E-1 | 1.5 |

TABLE 1-continued

|  | | | | | | | | |
|---|---|---|---|---|---|---|---|---|
| Leveling agent (F) | | | | | | | F-1 | 2.5 |
| Viscosity without solvent | 540 mP·s (50° C.) | | | | | | | |
| Solvent (G) | G-1 | 429 | G-1 | 792 | G-1 | 358 | G-1 | 379 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 529 nm | | 505 nm | | 518 nm | | 496 nm | |
| UV light source | LED | | LED | | LED | | LED | |
| UV irradiation amount | 750 mJ | | 750 mJ | | 750 mJ | | 750 mJ | |
| Si etch selectivity | 3.13 | | 2.78 | | 2.36 | | 2.05 | |

|  | Ex. 13 | | Ex. 14 | | Ex. 15 | | Ex. 16 | |
|---|---|---|---|---|---|---|---|---|
|  | Type | Amount | Type | Amount | Type | Amount | Type | Amount |
| Photocurable monomer (A) | A-1 | 50 | A-1 | 50 | A-1 | 50 | A-1 | 50 |
| Photocurable monomer (B) | B-4 | 50 | B-5 | 50 | B-6 | 50 | B-6 | 50 |
| Photopolymerization initiator (C) | C-3 | 5 | C-1 | 10 | C-3 | 5 | C-3 | 5 |
| Viscosity-adjusting agent (D) | D-1 | 1 | | | D-1 | 1 | D-3 | 42.8 |
| Sensitizer (E) | E-1 | 1.5 | | | E-1 | 1.5 | E-1 | 1.5 |
| Leveling agent (F) | F-1 | 2.5 | | | F-1 | 2.5 | | |
| Viscosity without solvent | | | | | | | | |
| Solvent (G) | G-1 | 379 | G-1 | 368 | G-1 | 990 | G-1 | 729 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 540 nm | | 501 nm | | 526 nm | | 505 nm | |
| UV light source | LED | | LED | | LED | | LED | |
| UV irradiation amount | 750 mJ | | 750 mJ | | 750 mJ | | 750 mJ | |
| Si etch selectivity | 2.11 | | 2.36 | | 2.32 | | 2.39 | |

|  | Ex. 17 | | Ex. 18 | | Ex. 19 | | Ex. 20 | |
|---|---|---|---|---|---|---|---|---|
|  | Type | Amount | Type | Amount | Type | Amount | Type | Amount |
| Photocurable monomer (A) | A-1 | 70 | A-1 | 80 | A-1 | 50 | A-1 | 50 |
| Photocurable monomer (B) | B-6 | 30 | B-6 | 20 | B-7 | 50 | B-8 | 50 |
| Photopolymerization initiator (C) | C-3 | 5 | C-3 | 5 | C-3 | 5 | C-3 | 5 |
| Viscosity-adjusting agent (D) | D-3 | 42.8 | D-1 | 1 | D-1 | 1 | D-1 | 1 |
| Sensitizer (E) | E-1 | 1.5 | E-1 | 1.5 | E-1 | 1.5 | E-1 | 1.5 |
| Leveling agent (F) | | | F-1 | 2.5 | F-1 | 2.5 | F-1 | 2.5 |
| Viscosity without solvent | | | | | 1,452 mPa·s (25° C.) | | 112 mPa·s (50° C.) | |
| Solvent (G) | G-1 | 729 | G-1 | 440 | G-1 | 358 | G-1 | 390 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 1.0 sec 2,000 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 497 nm | | 544 nm | | 519 nm | | 502 nm | |
| UV light source | LED | | LED | | LED | | LED | |
| UV irradiation amount | 750 mJ | | 750 mJ | | 750 mJ | | 750 mJ | |
| Si etch selectivity | 2.62 | | 2.38 | | 2.08 | | 2.60 | |

|  | Ex. 21 | | Ex. 22 | | Ex. 23 | |
|---|---|---|---|---|---|---|
|  | Type | Amount | Type | Amount | Type | Amount |
| Photocurable monomer (A) | A-1 | 50 | A-1 | 70 | A-1 | 70 |
| Photocurable monomer (B) | B-9 | 50 | B-9 | 30 | B-9 | 30 |
| Photopolymerization initiator (C) | C-3 | 5 | C-3 | 5 | C-3 | 5 |
| Viscosity-adjusting agent (D) | D-1 | 1 | D-1 | 1 | D-3 | 11.5 |
| Sensitizer (E) | E-1 | 1.5 | E-1 | 1.5 | E-1 | 1.5 |
| Leveling agent (F) | F-1 | 2.5 | F-1 | 2.5 | F-1 | 2.5 |
| Viscosity without solvent | | | | | | |
| Solvent (G) | G-1 | 368 | G-1 | 330 | G-1 | 457 |
| Type of substrate | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | |
| Film thickness | 498 nm | | 504 nm | | 492 nm | |
| UV light source | Hg | | Hg | | Hg | |
| UV irradiation amount | 750 mJ | | 750 mJ | | 750 mJ | |
| Si etch selectivity | 2.30 | | 2.65 | | 2.87 | |

TABLE 2

|  | Comp. Ex. 1 | | Comp. Ex. 2 | | Comp. Ex. 3 | | Comp. Ex. 4 | |
| --- | --- | --- | --- | --- | --- | --- | --- | --- |
|  | Type | Amount | Type | Amount | Type | Amount | Type | Amount |
| Photocurable monomer (A) | A-1 | 100 | | | | | | |
| Photocurable monomer (B) | | | B-1 | 100 | B-1 | 100 | B-2 | 100 |
| Photocurable monomer (B) | | | | | | | | |
| Photocurable monomer (H) | | | | | | | | |
| Photocurable monomer (H) | | | | | | | | |
| Photocurable monomer (H) | | | | | | | | |
| Photopolymerization initiator (C) | C-1 | 10 | C-1 | 10 | C-1 | 10 | C-1 | 10 |
| Viscosity-adjusting agent (D) | | | | | | | | |
| Sensitizer (E) | | | | | | | | |
| Leveling agent (F) | | | | | | | | |
| Viscosity without solvent | Solid at room temperature | | | | | | | |
| Solvent (G) | G-1 | 313 | G-1 | 440 | G-1 | 440 | G-1 | 440 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | x Solid content precipitated | | ○ | | ○ | | ○ | |
| Film thickness | | | 474 nm | | Tacky (insufficient curing) | | 502 nm | |
| UV light source | | | Hg | | LED | | Hg | |
| UV irradiation amount | | | 750 mJ | | 750 mJ | | 750 mJ | |
| Si etch selectivity | | | 1.66 | | Tacky (insufficient curing) | | 1.76 | |

|  | Comp. Ex. 5 | | Comp. Ex. 6 | | Comp. Ex. 7 | | Comp. Ex. 8 | |
| --- | --- | --- | --- | --- | --- | --- | --- | --- |
|  | Type | Amount | Type | Amount | Type | Amount | Type | Amount |
| Photocurable monomer (A) | | | | | | | | |
| Photocurable monomer (B) | B-2 | 100 | B-3 | 100 | B-4 | 100 | B-5 | 100 |
| Photocurable monomer (B) | | | | | | | | |
| Photocurable monomer (H) | | | | | | | | |
| Photocurable monomer (H) | | | | | | | | |
| Photocurable monomer (H) | | | | | | | | |
| Photopolymerization initiator (C) | C-1 | 10 | C-3 | 5 | C-3 | 5 | C-1 | 10 |
| Viscosity-adjusting agent (D) | | | D-1 | 1 | D-1 | 1 | | |
| Sensitizer (E) | | | E-1 | 1.5 | E-1 | 1.5 | | |
| Leveling agent (F) | | | F-1 | 2.5 | F-1 | 2.5 | | |
| Viscosity without solvent | | | | | 840 mPa·s (25° C.) | | | |
| Solvent (G) | G-1 | 440 | G-1 | 330 | G-1 | 390 | G-1 | 368 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | Tacky (insufficient curing) | | 502 nm | | 500 nm | | 501 nm | |
| UV light source | LED | | LED | | LED | | Hg | |
| UV irradiation amount | 750 mJ | | 750 mJ | | 750 mJ | | 750 mJ | |
| Si etch selectivity | Tacky (insufficient curing) | | 1.80 | | 1.61 | | 1.35 | |

TABLE 2-continued

|  | Comp. Ex. 9 | | Comp. Ex. 10 | | Comp. Ex. 11 | | Comp. Ex. 12 | |
| --- | --- | --- | --- | --- | --- | --- | --- | --- |
|  | Type | Amount | Type | Amount | Type | Amount | Type | Amount |
| Photocurable monomer (A) | | | | | | | | |
| Photocurable monomer (B) | B-6 | 100 | B-7 | 100 | B-8 | 100 | B-9 | 100 |
| Photocurable monomer (B) | | | | | | | | |
| Photocurable monomer (H) | | | | | | | | |
| Photocurable monomer (H) | | | | | | | | |
| Photocurable monomer (H) | | | | | | | | |
| Photopolymerization initiator (C) | C-3 | 5 | C-3 | 5 | C-3 | 5 | C-3 | 5 |
| Viscosity-adjusting agent (D) | D-1 | 1 | D-1 | 1 | D-1 | 1 | D-1 | 1 |
| Sensitizer (E) | E-1 | 1.5 | E-1 | 1.5 | E-1 | 1.5 | E-1 | 1.5 |
| Leveling agent (F) | F-1 | 2.5 | F-1 | 2.5 | F-1 | 2.5 | F-1 | 2.5 |
| Viscosity without solvent | 244 mPa·s (25° C.) | | | | | | | |
| Solvent (G) | G-1 | 1,112 | G-1 | 440 | G-1 | 469 | G-1 | 440 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | ○ | | ○ | | ○ | | ○ | |
| Film thickness | 518 nm | | 487 nm | | 511 nm | | 494 nm | |
| UV light source | LED | | LED | | LED | | LED | |
| UV irradiation amount | 750 mJ | | 750 mJ | | 750 mJ | | 750 mJ | |
| Si etch selectivity | 1.60 | | 1.32 | | 1.19 | | 1.85 | |

|  | Comp. Ex. 13 | | Comp. Ex. 14 | | Comp. Ex. 15 | | Comp. Ex. 16 | |
| --- | --- | --- | --- | --- | --- | --- | --- | --- |
|  | Type | Amount | Type | Amount | Type | Amount | Type | Amount |
| Photocurable monomer (A) | A-1 | 90 | A-1 | 20 | A-1 | 90 | | |
| Photocurable monomer (B) | B-1 | 10 | B-1 | 80 | B-6 | 10 | B-1 | 50 |
| Photocurable monomer (B) | | | | | | | B-2 | 50 |
| Photocurable monomer (H) | | | | | | | | |
| Photocurable monomer (H) | | | | | | | | |
| Photocurable monomer (H) | | | | | | | | |
| Photopolymerization initiator (C) | C-2 | 10 | C-2 | 5 | C-3 | 5 | C-1 | 10 |
| Viscosity-adjusting agent (D) | | | | | D-1 | 1 | | |
| Sensitizer (E) | | | | | E-1 | 1.5 | | |
| Leveling agent (F) | | | | | F-1 | 2.5 | | |
| Viscosity without solvent | | | | | | | | |
| Solvent (G) | G-1 | 313 | G-1 | 372 | G-1 | 990 | G-1 | 414 |
| Type of substrate | 2 inch Si wafer | | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film stability and volatility | x Solid content precipitated | | ○ | | x Solid content precipitated | | ○ | |
| Film thickness | | | 518 nm | | | | 502 nm | |
| UV light source | | | LED | | | | Hg | |
| UV irradiation amount | | | 750 mJ | | | | 750 mJ | |
| Si etch selectivity | | | 1.80 | | | | 1.71 | |

|  | Comp. Ex. 17 | | Comp. Ex. 18 | | Comp. Ex. 19 | |
| --- | --- | --- | --- | --- | --- | --- |
|  | Type | Amount | Type | Amount | Type | Amount |
| Photocurable monomer (A) | | | | | | |
| Photocurable monomer (B) | | | | | | |
| Photocurable monomer (B) | | | | | | |
| Photocurable monomer (H) | H-1 | 70 | H-3 | 59 | | |
| Photocurable monomer (H) | H-2 | 30 | H-4 | 11 | | |
| Photocurable monomer (H) | | | H-5 | 30 | | |
| Photopolymerization initiator (C) | C-3 | 5 | C-4 | 10 | | |
| Viscosity-adjusting agent (D) | D-1 | 1 | | | D-3 | 100 |
| Sensitizer (E) | E-1 | 1.5 | | | | |
| Leveling agent (F) | F-1 | 2.5 | F-1 | 1 | | |
| Viscosity without solvent | | | | | | |
| Solvent (G) | G-1 | 134 | | | G-1 | 900 |
| Type of substrate | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 1.0 sec 2,000 rpm × 20 sec | |
| Film stability and volatility | x Film thickness reduced (by 94%) | | ○ | | (Film stability not evaluated since the film is a polymer film) | |
| Film thickness | | | 980 nm | | 502 nm | |
| UV light source | | | Hg | | — | |

TABLE 2-continued

| | | |
|---|---|---|
| UV irradiation amount | 1,000 mJ | — |
| Si etch selectivity | 0.50 | 2.08 |

TABLE 3

| | | Name |
|---|---|---|
| Photocurable monomer (A) | A-1 | N-Vinylcarbazole |
| Photocurable monomer (B) | B-1 | Bisarylfluorene type compound (tradename: OGSOL EA-0200) |
| | B-2 | 9,9-Bis[4-(2-acryloyloxyethoxy)phenyl]fluorene (tradename: A-BPEF) |
| | B-3 | Tricyclodecanedimethanol divinyl ether |
| | B-4 | Pentacyclopentadecanedimethanol divinyl ether |
| | B-5 | Tricyclodecanedimethanol diacrylate (tradename A-DCP) |
| | B-6 | Hydrogenated bisphenol A divinyl ether |
| | B-7 | Epoxy resin jER, grade YX8000 |
| | B-8 | Epoxy resin jER, grade YX8034 |
| | B-9 | 9,9-Bis[4-(2-vinyl ether ethoxy)phenyl]fluorene |
| Photopolymerization initiator (C) | C-1 | Irgacure 907 |
| | C-2 | Irgacure 379 |
| | C-3 | WPI-113 |
| | C-4 | Irgacure 651 |
| Viscosity-adjusting agent (D) | D-1 | Ethylene/methylphenyl norbornene copolymer |
| | D-2 | Polyhydroxystyrene (MARUKA LYNCUR M S-2) |
| | D-3 | Poly(9-vinylcarbazole) |
| Sensitizer (E) | E-1 | UVS-1221 |
| Leveling agent (F) | F-1 | DISPARLON 1761 |
| Solvent (G) | G-1 | Cyclohexanone |
| Photocurable monomer (H) | H-1 | Tricyclodecane vinyl ether |
| | H-2 | 1-Adamantyl vinyl ether |
| | H-3 | Tripropylene glycol diacrylate (tradename: APG-200) |
| | H-4 | Trimethylolpropane triacrylate (tradename: A-TMPT) |
| | H-5 | N-Vinyl-2-pyrrolidone |

TABLE 4

| | Ex. 24 | | Ex. 25 | | Ex. 26 | |
|---|---|---|---|---|---|---|
| | Type | Amount | Type | Amount | Type | Amount |
| Photocurable monomer (A) | A-1 | 50 | A-1 | 70 | A-1 | 50 |
| Photocurable monomer (B) | B-1 | 50 | B-1 | 30 | B-4 | 50 |
| Photopolymerization initiator (C) | C-2 | 10 | C-2 | 10 | C-3 | 5 |
| Viscosity-adjusting agent (D) | | | D-3 | 11.5 | D-1 | 1 |
| Sensitizer (E) | | | | | E-1 | 1.5 |
| Leveling agent (F) | | | | | F-1 | 2.5 |
| Solvent (G) | G-1 | 1,112 | G-1 | 1,614 | G-1 | 1,048 |
| Type of substrate | 2 inch Si wafer | | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | | 400 rpm × 5 sec slope 3.5 sec 4,500 rpm × 20 sec | |
| Film thickness | 157 nm | | 155 nm | | 167 nm | |
| UV light source | LED | | LED | | LED | |
| UV irradiation amount | 750 mJ | | 750 mJ | | 750 mJ | |
| Fine shape of transparent resin mold | Circular pillar | | Circular hole | | Hexagonal hole | |
| Transfer property | ◯ | | ◯ | | ◯ | |
| Transfer shape | Circular hole | | Circular pillar | | Hexagonal pillar | |

| | Ex. 27 | | Comp. Ex. 20 | |
|---|---|---|---|---|
| | Type | Amount | Type | Amount |
| Photocurable monomer (A) | A-1 | 50 | | |
| Photocurable monomer (B) | B-6 | 50 | | |
| Photopolymerization initiator (C) | C-3 | 5 | | |
| Viscosity-adjusting agent (D) | D-3 | 42.8 | D-3 | 100 |
| Sensitizer (E) | E-1 | 1.5 | | |
| Leveling agent (F) | | | | |
| Solvent (G) | G-1 | 1,717 | G-1 | 900 |
| Type of substrate | 2 inch Si wafer | | 2 inch Si wafer | |
| Spin coating conditions | 400 rpm × 5 sec slope 3.5 sec 4,500 rpm × 20 sec | | 400 rpm × 5 sec slope 3.5 sec 4,500 rpm × 20 sec | |
| Film thickness | 161 nm | | 351 nm | |
| UV light source | LED | | LED | |
| UV irradiation amount | 750 mJ | | 750 mJ | |
| Fine shape of transparent resin mold | Circular hole | | Circular hole | |
| Transfer property | ◯ | | x | |
| Transfer shape | Circular pillar | | No fine shape transferred | |

INDUSTRIAL APPLICABILITY

The resin composition for photoimprinting of the present invention is applicable to production of an etching mask to form a fine pattern on a semiconductor substrate or a metal substrate.

The entire disclosure of Japanese Patent Application No. 2011-004522 filed on Jan. 13, 2011 including specification, claims, drawings and summary is incorporated herein by reference in its entirety.

The invention claimed is:

1. A resin composition, comprising:
a photocurable monomer (A),
a photocurable monomer (B),
a photopolymerization initiator (C), and
a viscosity-adjusting agent (D) of a polymer comprising a carbazole skeleton,
wherein
the photocurable monomer (A) comprises a carbazole compound of formula (I),
the photocurable monomer (B) comprises at least one member selected from the group consisting of a compound of formula (II), a compound of formula (III), and a compound of formula (IV), and
a weight ratio of the photocurable monomer (A) to the photocurable monomer (B) is from 30/70 to 87/13, Formula (I)

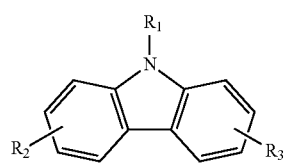

wherein
$R_1$ is $-CH=CH_2$, $-CH_2CH_2-O-CH=CH_2$, $-CH_2-C(CH_3)=CH_2$ or a glycidyl group, and
$R_2$ and $R_3$ each is independently hydrogen or a $C_{1-4}$ alkyl group;

Formula (II)

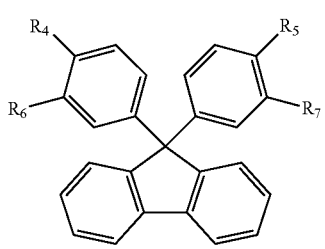

wherein
$R_4$ and $R_5$ each is independently $-O-CH=CH_2$, $-O-CH_2CH_2-O-CH=CH_2$, $-O-CO-CH=CH_2$, $-O-CO-C(CH_3)=CH_2$, $-O-CH_2CH_2-O-CO-CH=CH_2$, $-O-CH_2CH_2-O-CO-C(CH_3)=CH_2$ or a glycidyl ether group, and
$R_6$ and $R_7$ each is independently hydrogen or a $C_{1-4}$ alkyl group;

Formula (III)

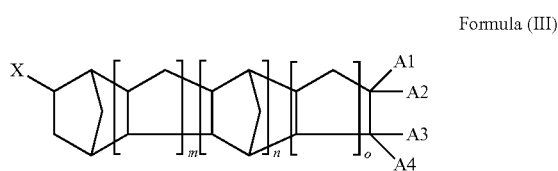

wherein
X is $-O-CH=CH_2$, $-CH_2-O-CH=CH_2$, $-O-CO-CH=CH_2$, $-O-CO-C(CH_3)=CH_2$, $-CH_2-O-CO-CH=CH_2$, $-CH_2-O-CO-C(CH_3)=CH_2$ or a glycidyl ether group,
A1 to A4 each is independently a hydrogen atom, a methyl group, an ethyl group, a phenyl group, $-OH$, $-CH_2-OH$, $-O-CH=CH_2$, $-CH_2-O-CH=CH_2$, $-O-CO-CH=CH_2$, $-O-CO-C(CH_3)=CH_2$, $-CH_2-O-CO-CH=CH_2$, $-CH_2-O-CO-C(CH_3)=CH_2$ or a glycidyl ether group, with the proviso that at least one of A1 to A4 is $-O-CH=CH_2$, $-CH_2-O-CH=CH_2$, $-O-CO-CH=CH_2$, $-O-CO-C(CH_3)=CH_2$, $-CH_2-O-CO-CH=CH_2$, $-CH_2-O-CO-C(CH_3)=CH_2$ or a glycidyl ether group, and
m, n, and o each is independently 0 or 1; and Formula (IV)

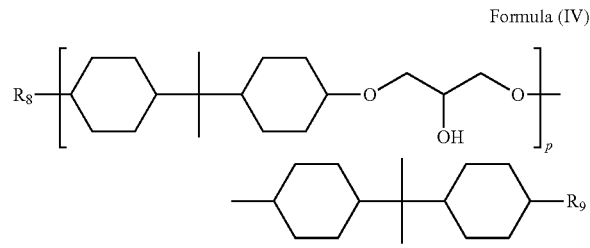

wherein
$R_8$ and $R_9$ each is independently $-O-CH=CH_2$, $-O-CH_2CH_2-O-CH=CH_2$, $-O-CO-CH=CH_2$, $-O-CO-C(CH_3)=CH_2$, $-O-CH_2CH_2-O-CO-CH=CH_2$, $-O-CH_2CH_2-O-CO-C(CH_3)=CH_2$ or a glycidyl ether group, and
p is an integer of 0 or at least 1.

2. The resin composition according to claim 1, comprising the viscosity-adjusting agent (D) in an amount of from 0.1 to 100 parts by weight per 100 parts by weight of a total weight of the photocurable monomer (A) and the photocurable monomer (B).

3. The resin composition according to claim 2, further comprising a solvent (G) in an amount of from 0.5 to 30,000 parts by weight per 100 parts by weight of the total weight of the photocurable monomer (A) and the photocurable monomer (B).

4. The resin composition according to claim 1, further comprising a solvent (G) in an amount of from 0.5 to 30,000 parts by weight per 100 parts by weight of a total weight of the photocurable monomer (A) and the photocurable monomer (B).

5. A resin thin film, comprising a cured product having a film thickness of from 10 nm to 40 μm, wherein the cured product is formed from the resin composition according to claim 1.

6. A pattern forming process, comprising:
applying a resin composition to a substrate to form a coating film;
bringing a pattern surface of a mold having a desired pattern into contact with a surface of the coating film and pressurizing them so that spaces in the desired pattern are filled with the resin composition;
curing the resin composition by light irradiation, thereby obtaining a cured resin; and
separating the mold from the cured resin,
wherein
the resin composition comprises: a photocurable monomer (A),
a photocurable monomer (B),
a photopolymerization initiator (C), and
a viscosity-adjusting agent (D) of a polymer comprising a carbazole skeleton,
wherein
the photocurable monomer (A) comprises a carbazole compound of formula (I),
the photocurable monomer (B) comprises at least one member selected from the group consisting of a compound of formula (II), a compound of formula (III), and a compound of formula (IV), and
a weight ratio of the photocurable monomer (A) to the photocurable monomer (B) is from 30/70 to 87/13,

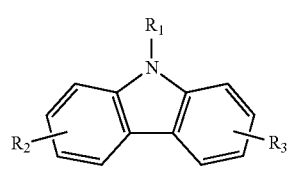

Formula (I)

wherein
$R_1$ is —CH=$CH_2$, —$CH_2CH_2$—O—CH=$CH_2$, —$CH_2$—C($CH_3$)=$CH_2$ or a glycidyl group, and $R_2$ and $R_3$ each is independently hydrogen or a $C_{1-4}$ alkyl group;

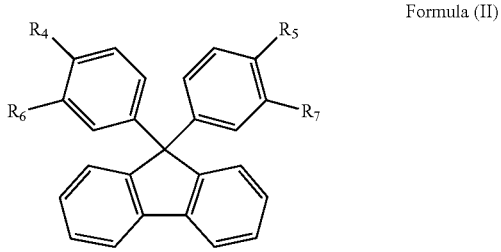

Formula (II)

wherein
$R_4$ and $R_5$ each is independently —O—CH=$CH_2$, —O—$CH_2CH_2$—O—CH=$CH_2$, —O—CO—CH=$CH_2$, —O—CO—C($CH_3$)=$CH_2$, —O—$CH_2CH_2$—O—CO—CH=$CH_2$, —O—$CH_2CH_2$—O—CO—C($CH_3$)=$CH_2$ or a glycidyl ether group, and
$R_6$ and $R_7$ each is independently hydrogen or a $C_{1-4}$ alkyl group;

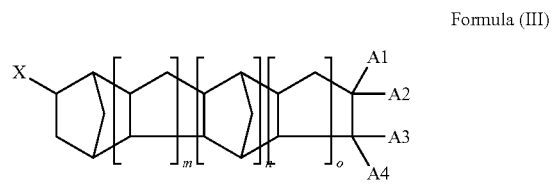

Formula (III)

wherein
X is —O—CH=$CH_2$, —$CH_2$—O—CH=$CH_2$, —O—CO—CH=$CH_2$, —O—CO—C($CH_3$)=$CH_2$, —$CH_2$—O—CO—CH=$CH_2$, —$CH_2$—O—CO—C($CH_3$)=$CH_2$ or a glycidyl ether group,
A1 to A4 each is independently a hydrogen atom, a methyl group, an ethyl group, a phenyl group, —OH, —$CH_2$—OH, —O—CH=$CH_2$, —$CH_2$—O—CH=$CH_2$, —O—CO—CH=$CH_2$, —O—CO—C($CH_3$)=$CH_2$, —$CH_2$—O—CO—CH=$CH_2$, —$CH_2$—O—CO—C($CH_3$)=$CH_2$ or a glycidyl ether group, with the proviso that at least one of A1 to A4 is —O—CH=$CH_2$, —$CH_2$—O—CH=$CH_2$, —O—CO—CH=$CH_2$, —O—CO—C($CH_3$)=$CH_2$, —$CH_2$—O—CO—CH=$CH_2$, —$CH_2$—O—CO—C($CH_3$)=$CH_2$ or a glycidyl ether group, and
m, n, and o each is independently 0 or 1; and

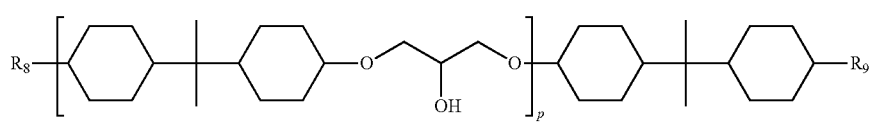

Formula (IV)

wherein $R_8$ and $R_9$ each is independently —O—CH=CH$_2$, —O—CH$_2$CH$_2$—O—CH=CH$_2$, —O—CO—CH=CH$_2$, —O—CO—C(CH$_3$)=CH$_2$, —O—CH$_2$CH$_2$—O—CO—CH=CH$_2$, C(CH$_3$)=CH$_2$ or a glycidyl ether group, and p is an integer of 0 or at least 1.

7. The pattern forming process according to claim 6, further comprising:

etching the substrate using the cured resin as a mask.

8. A fine structure obtained by a process comprising:

bringing a pattern surface of a mold having a desired pattern into contact with a resin surface of a resin composition, pressurizing the pattern surface and the resin surface so that spaces in the desired pattern are filled with the resin composition, curing the resin composition by light irradiation, thereby obtaining a cured resin, and separating the mold from the cured resin, wherein the resin composition comprises:

a photocurable monomer (A), a photocurable monomer (B), a photopolymerization initiator (C), and a viscosity-adjusting agent (D) of a polymer comprising a carbazole skeleton, wherein the photocurable monomer (A) comprises a carbazole compound of formula (I), the photocurable monomer (B) comprises at least one member selected from the group consisting of a compound of formula (II), a compound of formula (III), and a compound of formula (IV), and a weight ratio of the photocurable monomer (A) to the photocurable monomer (B) is from 30/70 to 87/13,

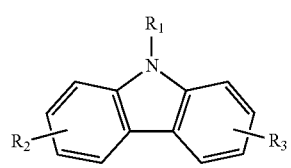

Formula (I)

wherein $R_1$ is —CH=CH$_2$, —CH$_2$CH$_2$—O—CH=CH$_2$, —CH$_2$—C(CH$_3$)=CH$_2$ or a glycidyl group, and $R_2$ and $R_3$ each is independently hydrogen or a $C_{1-4}$ alkyl group;

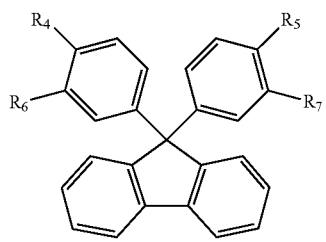

Formula (II)

wherein $R_4$ and $R_5$ each is independently —O—CH=CH$_2$, —O—CH$_2$CH$_2$—O—CH=CH$_2$, —O—CO—CH=CH$_2$, —O—CO—C(CH$_3$)=CH$_2$, —O—CH=CH$_2$—O—CO—CH=CH$_2$, —O—CH$_2$CH$_2$—O—CO—C(CH$_3$)=CH$_2$ or a glycidyl ether group, and $R_6$ and $R_7$ each is independently hydrogen or a $C_{1-4}$ alkyl group;

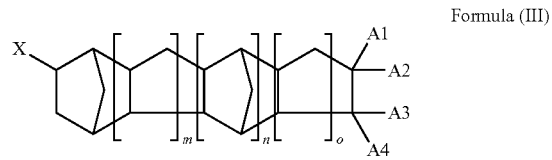

Formula (III)

wherein

X is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, A1 to A4 each is independently a hydrogen atom, a methyl group, an ethyl group, a phenyl group, —OH, —CH$_2$—OH, —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, with the proviso that at least one of A1 to A4 is —O—CH=CH$_2$, —CH$_2$—O—CH=CH$_2$, —O—CO—CH=CH$_2$, —O—CO—C(CH$_3$)=CH$_2$, —CH$_2$—O—CO—CH=CH$_2$, —CH$_2$—O—CO—C(CH$_3$)=CH$_2$ or a glycidyl ether group, and m, n, and o each is independently 0 or 1; and

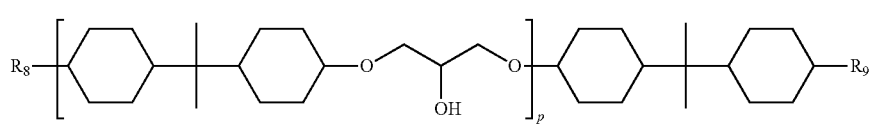

Formula (IV)

wherein $R_8$ and $R_9$ each is independently —O—CH=CH$_2$, —O—CH$_2$CH$_2$—O—CH=CH$_2$, —O—CO—CH=CH$_2$, —O—CO—C(CH$_3$)=CH$_2$, —O—CH$_2$CH$_2$—O—CO—CH=CH$_2$, —O—CH$_2$, —O—CH$_2$CH$_2$—O—CO—C(CH$_3$)=CH$_2$ or a glycidyl ether group, and p is an integer of 0 or at least 1.

9. An etching mask comprising a cured product of the resin composition according to claim 1.

\* \* \* \* \*